(12) United States Patent
Mizumura et al.

(10) Patent No.: US 8,178,933 B2
(45) Date of Patent: May 15, 2012

(54) SEMICONDUCTOR DEVICE

(75) Inventors: Akira Mizumura, Tokyo (JP); Hiroaki Ammo, Kanagawa (JP); Tetsuya Oishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/039,684

(22) Filed: Mar. 3, 2011

(65) Prior Publication Data

US 2011/0186932 A1 Aug. 4, 2011

Related U.S. Application Data

(63) Continuation of application No. 12/389,897, filed on Feb. 20, 2009, now Pat. No. 7,932,567.

(30) Foreign Application Priority Data

Mar. 12, 2008 (JP) ................... 2008-063006

(51) Int. Cl.
*H01L 27/088* (2006.01)
(52) U.S. Cl. .................. 257/401; 257/368; 257/E27.06
(58) Field of Classification Search .................. 257/368, 257/401, E27.06
See application file for complete search history.

(56) References Cited

U.S. PATENT DOCUMENTS

| | | | |
|---|---|---|---|
| 6,413,802 B1 * | 7/2002 | Hu et al. ................ | 438/151 |
| 7,105,934 B2 | 9/2006 | Anderson et al. | |
| 7,112,858 B2 | 9/2006 | Inaba et al. | |
| 7,932,567 B2 * | 4/2011 | Mizumura et al. ........... | 257/401 |
| 2002/0053671 A1 | 5/2002 | Koyama | |
| 2003/0193492 A1 | 10/2003 | Koyama | |
| 2006/0049460 A1 | 3/2006 | Chen | |
| 2007/0001219 A1 | 1/2007 | Radosavljevic et al. | |

FOREIGN PATENT DOCUMENTS

| | | |
|---|---|---|
| JP | 2000-036582 | 2/2000 |
| JP | 2000-223663 | 8/2000 |
| JP | 2001-274258 | 10/2001 |
| JP | 2002-368117 | 12/2002 |
| JP | 2005-056870 | 3/2005 |
| JP | 2005-086120 | 3/2005 |
| JP | 2006-310847 | 11/2006 |
| JP | 2006-318948 | 11/2006 |
| JP | 2007-053265 | 3/2007 |
| JP | 2007-287728 | 11/2007 |
| JP | 2008-004664 | 1/2008 |
| WO | 0259734 | 8/2002 |
| WO | 2005091374 | 9/2005 |

OTHER PUBLICATIONS

E. Lederer et al.; FinFET Analogue Characterization from DC to 100 GHz; Solid State Electronics, Elsevier Science Publishers; vol. 49, No. 9; Sep. 1, 2005.

* cited by examiner

*Primary Examiner* — Roy Potter
(74) *Attorney, Agent, or Firm* — SNR Denton US LLP

(57) ABSTRACT

A semiconductor device including first and second transistors, each of the first and second transistors being formed with a plurality of fin transistors, and the first and second transistors being connected in parallel to electrically share a source, wherein the plurality of fin transistors each include a fin activation layer, the fin activation layer protruding from a semiconductor substrate, a source layer serving as the source being formed on one end, and a drain layer on the other end of the fin activation layer so as to form a channel region, the fin activation layers are arranged adjacent to each other in parallel, and the drain layers are disposed so that the currents flow through the plurality of fin transistors in opposite directions between the first and second transistors.

11 Claims, 21 Drawing Sheets

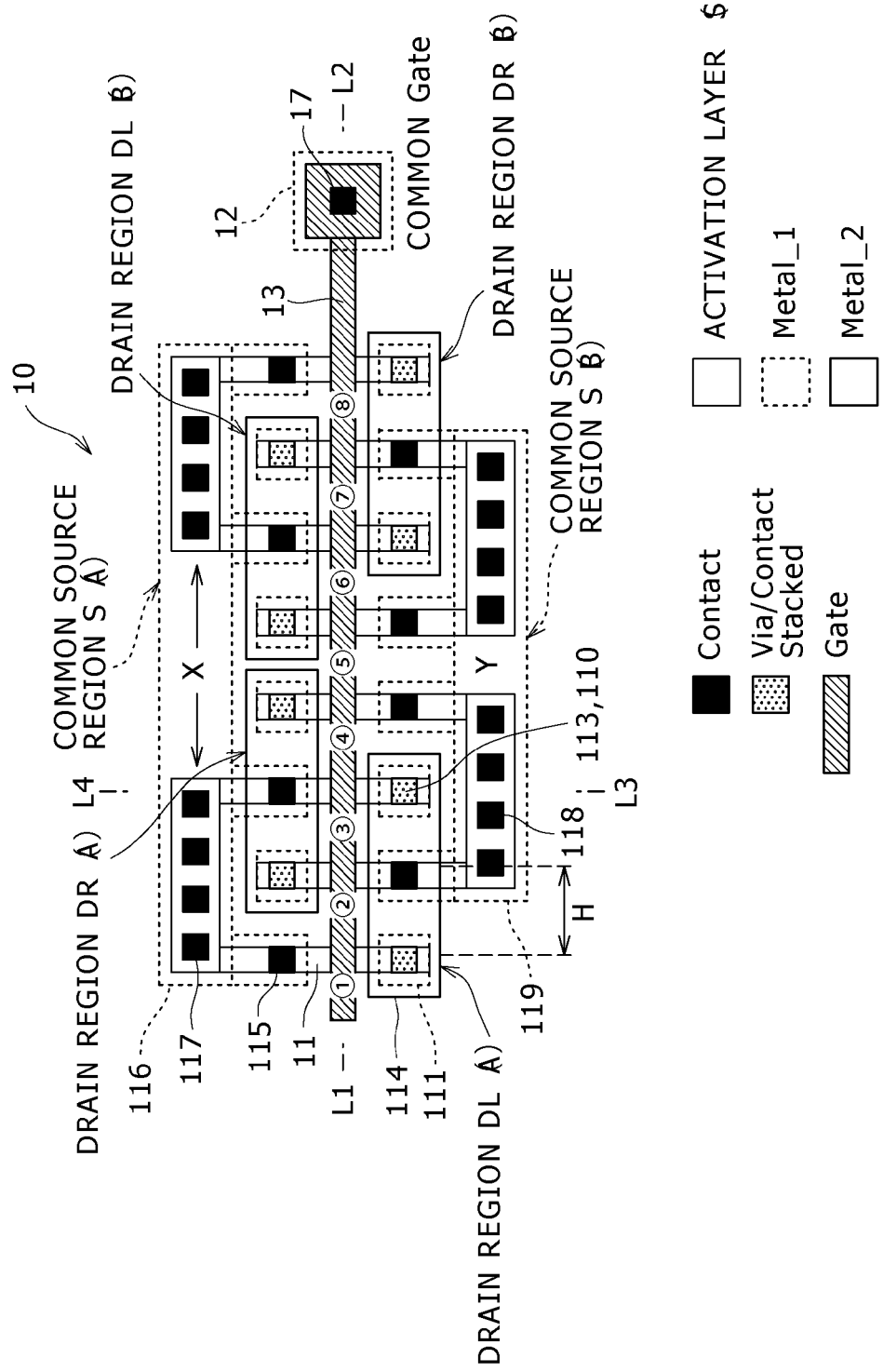

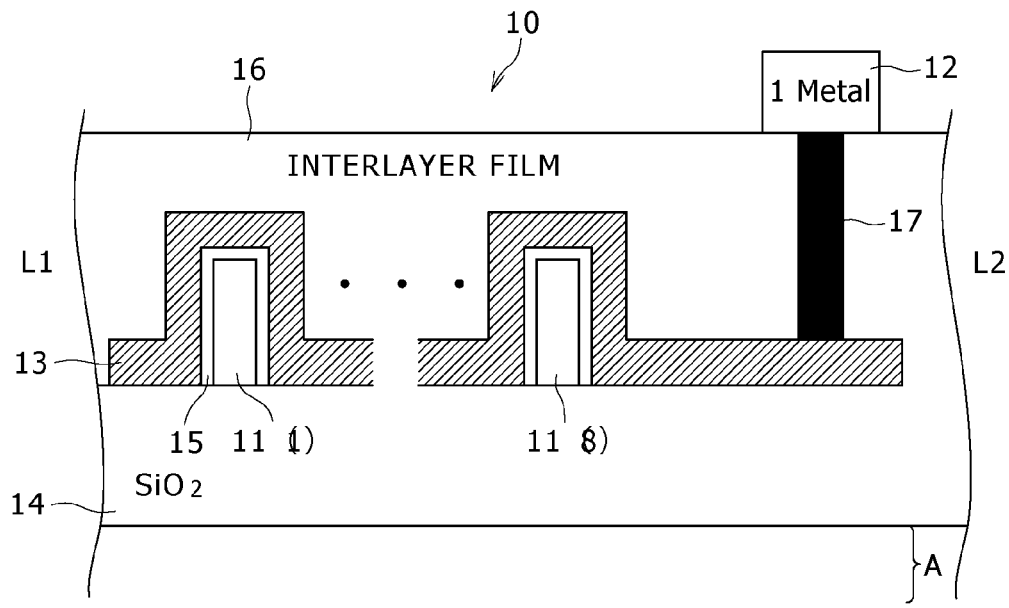
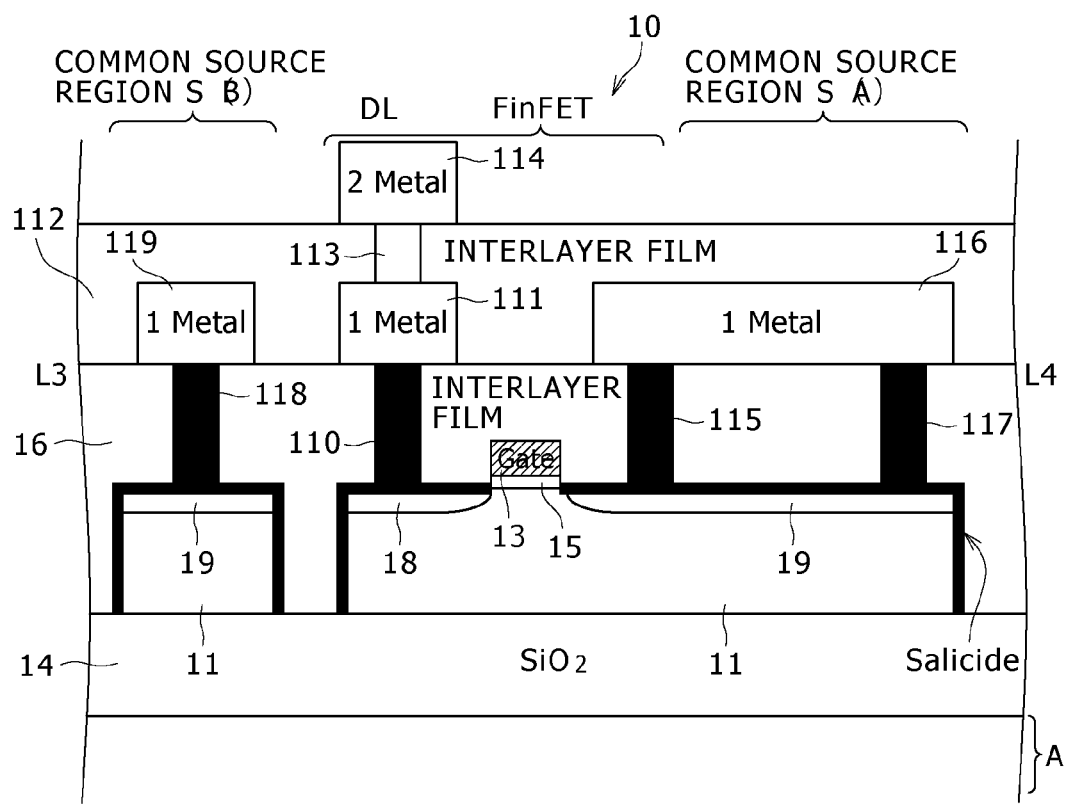

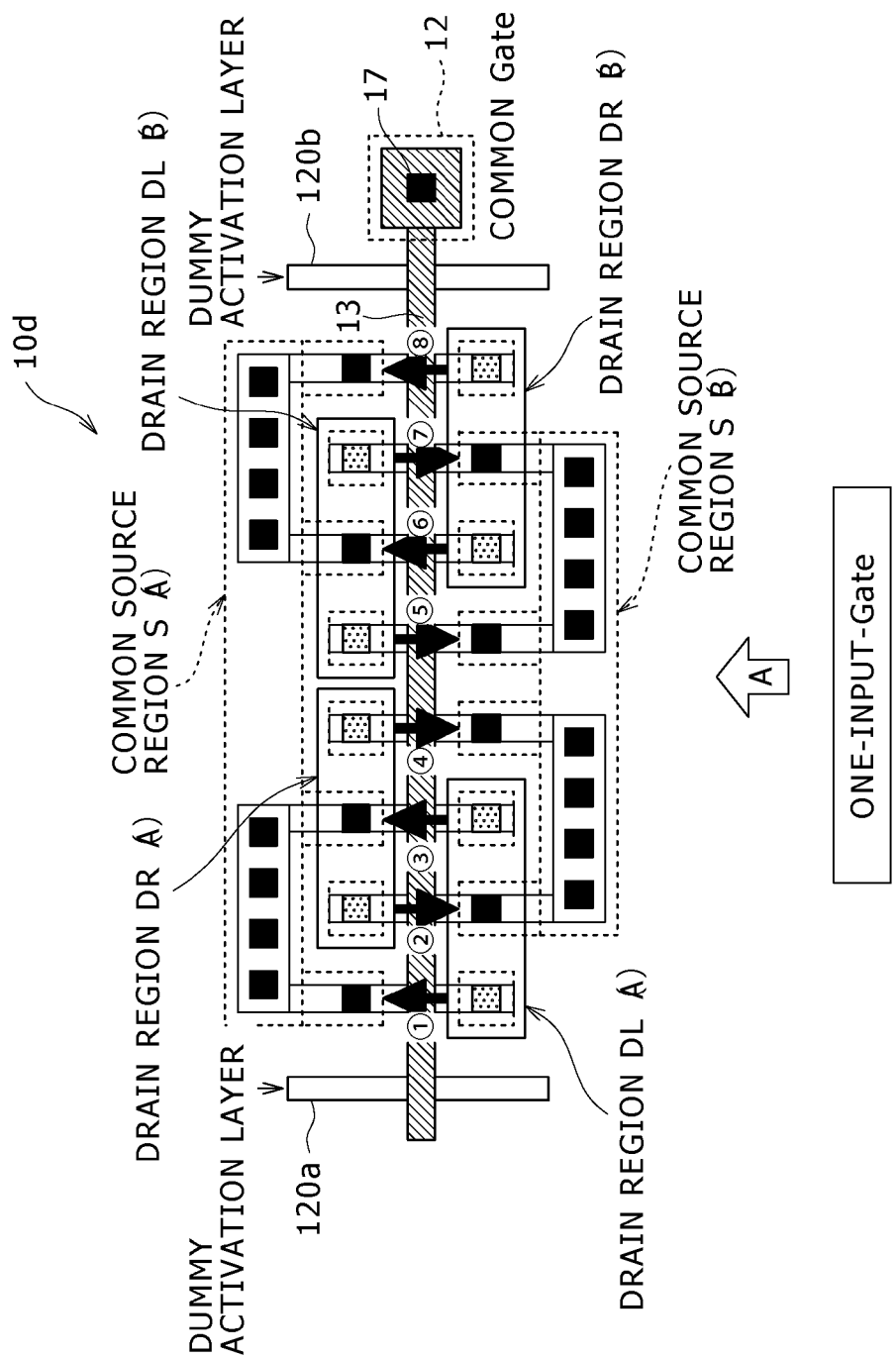
FIG.10 EXAMPLE WITH DUMMY ACTIVATION LAYER ON EACH END OF ROW OF ACTIVATION LAYERS)

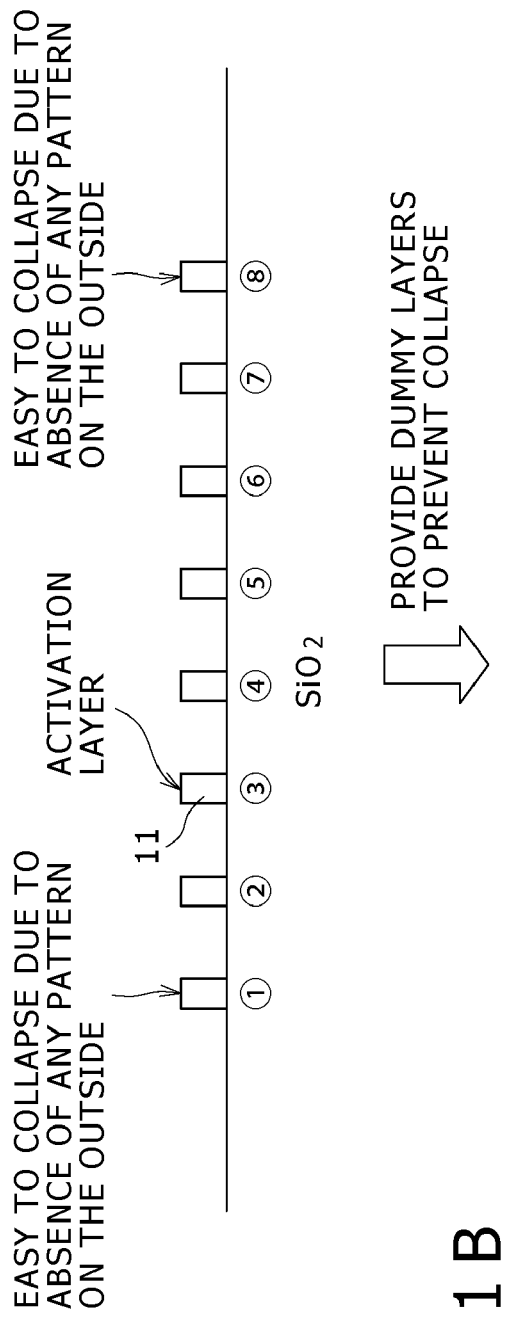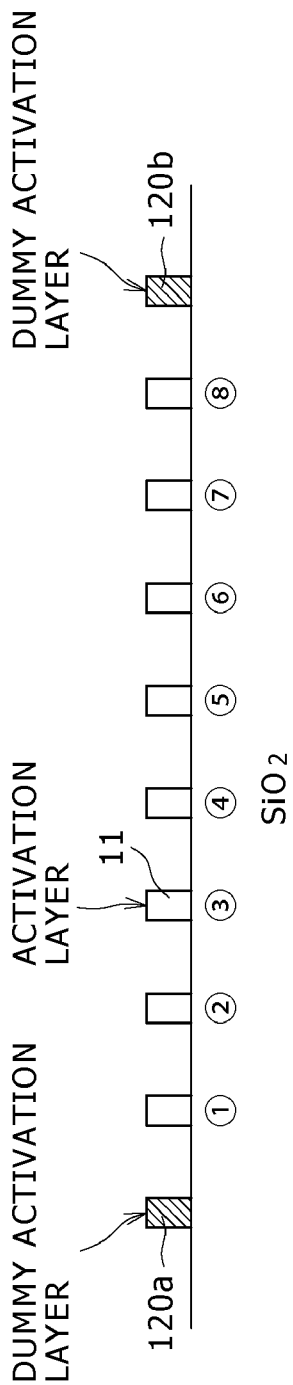

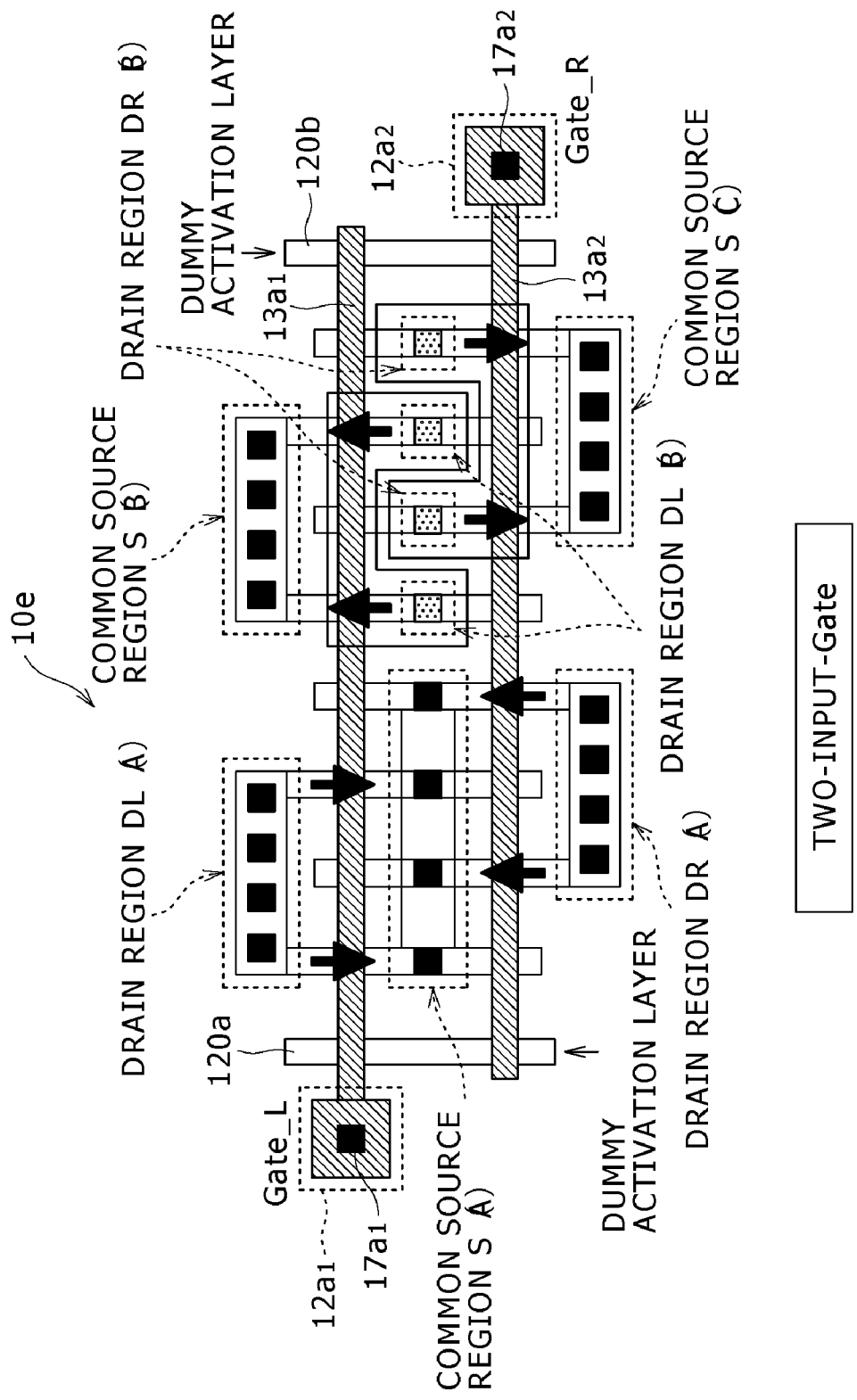

EXAMPLE WITH DUMMY Gate

EXAMPLE OF 3:1 PAIR RATIO, Tr_L:Tr_R=3:1

TWO PAIRS OF TRANSISTORS, ONE ARRANGED VERTICALLY AND ANOTHER HORIZONTALLY, CONNECTED TOGETHER SO AS TO ELIMINATE POTENTIAL IMPACT RESULTING FROM THE SUBSTRATE ORIENTATION)

(EXAMPLE OF ONE-INPUT-Gate PAIRED TRANSISTORS)

DISADVANTAGEOUS FOR Matching DUE TO LONG TRANSISTOR PITCH BETWEEN THE PAIRS

DIRECTIONS OF THE CURRENTS IN THE TWO PAIRS ARE OPPOSITE (EXAMPLE OF TWO-INPUT-Gate PAIRED TRANSISTORS)

DISADVANTAGEOUS FOR Matching DUE TO LONG TRANSISTOR PITCH BETWEEN THE PAIRS

DIRECTIONS OF THE CURRENTS IN THE TWO PAIRS ARE OPPOSITE

SEMICONDUCTOR DEVICE

RELATED APPLICATION DATA

This application is a continuation of U.S. patent application Ser. No. 12/389,897, filed Feb. 20, 2009, the entirety of which is incorporated herein by reference to the extent permitted by law. The present application claims the benefit of priority to Japanese Patent Application No. 2008-063006 filed in the Japan Patent Office on Mar. 12, 2008, the entirety of which is incorporated by reference herein to the extent permitted by law.

BACKGROUND OF THE INVENTION

The present invention relates, for example, to a semiconductor device having fin field effect transistors packaged thereon.

A reducing gate length resulting from the increasingly smaller size of field effect transistors (hereinafter referred to as FETs) leads to a short channel effect. The same effect causes a drain current to flow even in the absence of any source-to-drain channel. To suppress the same effect, a fin type FET (hereinafter referred to as a FinFET) has been proposed. Such FinFETs have been chiefly studied and developed for logics including memories (refer, for example, to Japanese Patent Laid-Open No. 2006-310847).

SUMMARY OF THE INVENTION

The structure of the FinFET proposed hitherto will be described below in relation to FIGS. 21A to 22C. FIGS. 21A to 21C are diagrams illustrating an example of one-input-gate paired transistors. FIGS. 22A to 22C are diagrams illustrating an example of two-input-gate paired transistors.

As illustrated in FIG. 21A, a source diffusion layer 520 is formed on one end, and a drain diffusion layer 530 on the other end of each of (fin) activation layers 510 (1) to 510 (6). The same layers 510 (1) to 510 (6) protrude from a semiconductor substrate. FinFETs (1) to (6) are formed with a gate electrode 550 which is formed between the source diffusion layer 520 and drain diffusion layer 530.

Then, a drain region Drain1 is formed with the drain diffusion layer 530 of the activation layers 510 (1) to 510 (3), and a drain region Drain2 with the drain diffusion layer 530 of the activation layers 510 (4) to 510 (6). The source diffusion layers 520 of the activation layers 510 (1) to 510 (6) are connected together by a common source region S. The gate electrode 550 is also connected to a common gate contact 540.

A transistor 500-1 illustrated in the equivalent circuit diagram of FIG. 21C is formed with the FinFETs (1) to (3), and a transistor 500-2 with the FinFETs (4) to (6).

The paired transistors 500-1 and 500-2 having a common source and gate and connected in parallel as illustrated in FIG. 21C are referred to as one-input-gate paired transistors.

FIG. 21B illustrates an example in which the FinFETs (1) to (3) and FinFETs (4) to (6) illustrated in FIG. 21A are arranged vertically to be opposed to each other relative to the common source region S.

On the other hand, FIG. 22A illustrates an example of two-input-gate paired transistors. In these paired transistors, the FinFETs (1) to (3) are connected to a gate contact 540-1 by a gate electrode 550-1, and the FinFETs (4) to (6) to a gate contact 540-2 by a gate electrode 550-2.

FIG. 22B illustrates an example in which the FinFETs (1) to (3) and FinFETs (4) to (6) are arranged vertically to be opposed to each other relative to the common source region S.

FIG. 22C illustrates an equivalent circuit diagram of the above example.

The examples shown in FIGS. 21A and 22A have a drawback in that the pitch width between the transistors is long. The shortest possible pitch width between the transistors is the best way to provide improved matching between the transistors. This method, however, involves technical difficulty in reducing the pitch width.

In the examples shown in FIGS. 21B and 22B, the source diffusion layer 520 is shared by the transistors. For this reason, the currents flow in opposite directions to each other through the channels formed in the activation layers 510 of the two transistors. As a result, the transistors are adversely affected by impact arising from the process (e.g., shadow effect of the ion injection), thus resulting in poor matching between the transistors.

It is desirable to provide a semiconductor device which offers a narrow pitch width and excellent matching between packaged fin field effect transistors.

A semiconductor device according to a first embodiment of the present invention includes first and second transistors. Each of the first and second transistors is formed with a plurality of fin transistors. The first and second transistors are connected in parallel to electrically share a source. The plurality of fin transistors each include a fin activation layer. The fin activation layer protrudes from a semiconductor substrate. A source layer serving as the source is formed on one end, and a drain layer on the other end of the fin activation layer so as to form a channel region. The fin activation layers are arranged adjacent to each other in parallel. The drain layers are disposed so that the currents flow through the plurality of fin transistors in opposite directions between the first and second transistors.

A gate electrode should preferably be formed via an insulating film on each of the fin activation layers between the drain and source layers. The gate electrodes on the fin activation layers should preferably be connected together.

A gate electrode should preferably be formed via an insulating film on each of the fin activation layers between the drain and source layers. The gate electrodes on the fin activation layers included in the first transistor should preferably be connected together. The gate electrodes on the fin activation layers included in the second transistor should preferably be connected together.

The semiconductor device should preferably include dummy activation layers adapted to maintain the form of each of the fin activation layers.

The semiconductor device should preferably include dummy gate electrodes adapted to maintain the form of each of the gate electrodes.

If the first and second transistors differ in size, the plurality of fin transistors should preferably be divided into first and second regions. The first region is formed with the fin transistors in such a manner as to provide a 1:1 size ratio between the first and second transistors. The second region is formed with the remaining fin transistors other than those forming the first region. The fin activation layers of the fin transistors formed in the second region form drains of the first or second transistor in a symmetrical manner so that the currents flowing from the drains of the first or second transistor cancel each other out.

The semiconductor device should preferably include a plurality of transistors including the first and second transistors. In the plurality of transistors, the fin activation layers of the first and second transistors are oriented differently from those of other transistors in order to reduce potential impact resulting from the orientations on the semiconductor substrate.

A semiconductor device according to an embodiment of the present invention includes first and second transistors. Each of the first and second transistors is formed with a plurality of fin transistors. The first and second transistors are connected in parallel to share a source. The plurality of fin transistors each include a fin activation layer. The fin activation layer protrudes from a semiconductor substrate. A source layer serving as a source is formed on one end, and a drain layer on the other end of the fin activation layer so as to form a channel region. The fin activation layers are arranged adjacent to each other in parallel so that the drain layers of the fin activation layers alternately form drains of the first and second transistor.

The present invention provides a semiconductor device which offers a narrow pitch width and excellent matching between packaged fin field effect transistors.

BRIEF DESCRIPTION OF THE DRAWINGS

FIG. 1 is a plan view illustrating an example of a semiconductor device according to a first embodiment;

FIGS. 2A and 2B are sectional views illustrating the semiconductor device shown in FIG. 1;

FIG. 10 is a plan view illustrating an example of a semiconductor device according to a third embodiment;

FIGS. 11A and 11B are sectional views for describing an example of the semiconductor device according to the third embodiment;

FIG. 12 is a plan view illustrating an example of the semiconductor device according to a fourth embodiment;

DETAILED DESCRIPTION OF THE PRESENTLY PREFERRED EMBODIMENTS

The preferred embodiments of the present invention will be described below in relation to the accompanying drawings.

First Embodiment

Figure 3:
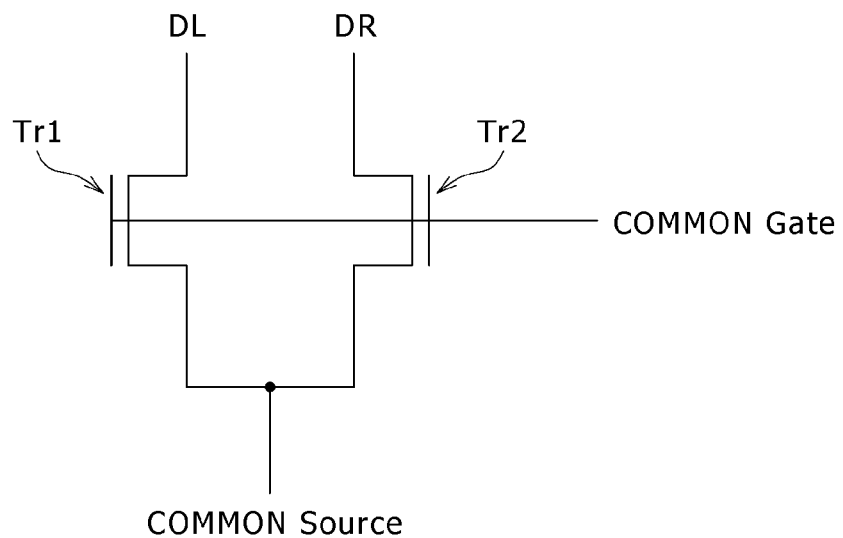
FIG. 3 is an equivalent circuit diagram of the semiconductor device shown in FIG. 1.
Figure 4:
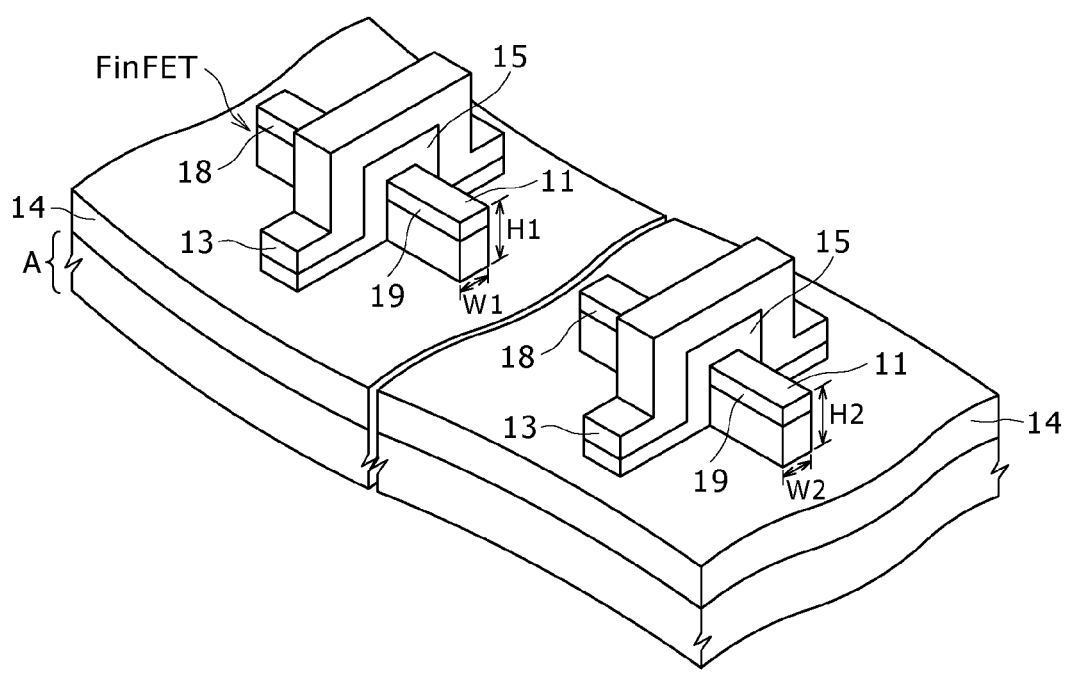
FIG. 4 is a stereoscopic view illustrating an example of a semiconductor device according to the first embodiment.

FIG. 1 is a plan view illustrating an example of a semiconductor device according to the present embodiment. FIGS. 2A and 2B are sectional views of the semiconductor device shown in FIG. 1. It should be noted that FIG. 2A is a sectional view taken on line L1-L2 in FIG. 1, and that FIG. 2B a sectional view taken on line L3-L4 in FIG. 1. FIG. 3 is an equivalent circuit diagram of the semiconductor device shown in FIG. 1. FIG. 4 is a stereoscopic view illustrating an example of a semiconductor device according to the present embodiment.

In a semiconductor device 10 illustrated in FIG. 1, eight fin activation layers (hereinafter simply referred to as activation layers) 11 are arranged with a pitch width H therebetween in such a manner as to cross a gate electrode 13. The gate electrode 13 is connected to a gate contact 12. The pitch width H depends upon the distance between the adjacent activation layers 11.

It should be noted that, in the description of the preferred embodiments given below, the numbers of the fin activation layers and other components are merely examples provided for convenience of explanation. For the sake of convenience, the activation layers 11 in FIG. 1 will be written as activation layer 11 (1) to 11 (8) from left to right on the page (for example, the activation layer 11 (1) corresponds to the number enclosed in a circle in FIG. 1). Similarly, the FinFETs and currents ID will be written in the same manner as appropriate, that is, FinFET (1) to FinFET (8).

A description will be given next of the sectional view taken along line L1-L2 in FIG. 1 primarily in relation to FIG. 2A.

The activation layers 11 (1) to 11 (8) are formed with silicon (Si) in such a manner as to protrude from a silicon oxide ($SiO_2$) film 14 which is formed on a semiconductor substrate A. The surfaces of the activation layers 11 (1) to 11 (8) are silicided.

Each of the activation layers 11 is covered with a gate electrode 13 except on the contact surface with the silicon oxide film 14. A gate insulating film 15 is provided between the activation layer 11 and gate electrode 13. The gate electrode 13 is formed, for example, with polysilicon (poly Si).

In FIG. 2A, the activation layer 11 (8) disposed at the end is connected to the gate contact 12 via a contact hole 17 made in part of an insulating first interlayer film 16 which covers the gate electrode 13.

The contact hole 17 and other contact holes which will be described later ("110," "115," "117" and "118" in FIG. 2B) are all filled, for example, with tungsten. Further, the gate contact 12 and other electrodes, i.e., electrodes 111 described later, drain electrodes 114 and source electrodes 116, are formed with aluminum. However, the material of these electrodes is not specifically limited to aluminum, but any other material may be used so long as it is conductive.

A description will be given next of the sectional view taken along line L3-L4 in FIG. 1 primarily in relation to FIG. 2B.

A drain diffusion layer 18 is formed on one end, and a source diffusion layer 19 on the other end of the activation layer 11 (3) shown in FIG. 1.

The drain diffusion layer 18 is connected to the electrode 111 via the contact hole 110 made in the first interlayer film 16.

The electrode 111 is connected to the drain electrode 114 via a contact hole 113 made in an insulating second interlayer film 112 which covers the top of the electrode 111.

On the other hand, the source diffusion layer 19 is connected to the source electrode 116 via the contact hole 115 made in the first interlayer film 16.

As illustrated in FIGS. 2B and 4, one FinFET is formed with the following, i.e., the drain diffusion layer 18 and source diffusion layer 19 of the activation layer 11, the electrodes (114 and 116) connected to the above diffusion layers via the contact hole, the gate electrode 13 formed on the activation layer 11 with the gate insulating film 15 sandwiched therebetween, and the gate contact 12 connected to this wiring.

We assume that both the drain diffusion layer 18 and source diffusion layer 19 are formed with an n-type layer. If a gate voltage $V_{GS}$ is applied to the gate contact 12, and a voltage $V_{DS}$ between the drain and source electrodes 114 and 116 so that a positive voltage is applied to the drain diffusion layer 18, a channel will be formed between the source and drain diffusion layers 19 and 18, causing a drain current to flow from the drain diffusion layer 18 to the source diffusion layer 19.

On the other hand, the source diffusion layer 19 is formed in the activation layer 11 shown on the L3 side in FIG. 2B. The source diffusion layer 19 forms part of a common source region S (A) shown in FIG. 1. The source diffusion layer 19 of the activation layer 11 is connected to a source electrode 119 via the contact hole 118 made in the first interlayer film 16.

A description will be given next of the arrangement of FinFETs illustrated in FIG. 1 in relation to the equivalent circuit diagram shown in FIG. 3.

Transistors Tr1 and Tr2 include eight FinFETs illustrated in FIG. 1. The transistors Tr1 and Tr2 have a common gate and are connected in parallel at their source as illustrated in FIG. 3.

More specifically, the first transistor includes the FinFETs (1), (3), (5) and (7), and the second transistor the FinFETs (2), (4), (6) and (8).

A drain DL of the transistor Tr1 and a drain DR of the transistor Tr2 alternately include the respective FinFETs.

Going into more detail, the electrodes 111 of the FinFETs (1) and (3) are connected together by the drain electrode 114 via the contact hole 113, thus forming a drain region DL (A).

Similarly, the electrodes 111 of the FinFETs (5) and (7) are connected together by the drain electrode 114 via the contact hole 113, thus forming a drain region DL (B).

For the sake of description of FIG. 1, the drain region is written separately as "DL (A)" and "DL (B)." However, the drain regions DL (A) and DL (B) are connected together on the further overlying layer, thus forming a drain DL (drain region DL) of the transistor Tr1 shown in FIG. 3.

Similarly as described above, a drain region DR (A) is formed with the electrodes 111 of the FinFETs (2) and (4), and a drain region DR (B) with the electrodes 111 of the FinFETs (6) and (8).

Then, the drain regions DR (A) and DR (B) are connected together on the further overlying layer, thus forming the drain DR (drain region DR) of the transistor Tr2 shown in FIG. 3.

On the other hand, the source electrodes 116 of the FinFETs (1) and (3) are connected together, and the source electrodes 116 of the FinFETs (5) and (7) also connected together, thus making up the source of the transistor Tr1.

Similarly, the source electrodes 116 of the FinFETs (2) and (4) are connected together, and the source electrodes 116 of the FinFETs (6) and (8) also connected together, thus making up the source of the transistor Tr2.

In order to connect together the sources of the transistors Tr1 and Tr2 shown in FIG. 3, the source electrodes 116 of the FinFETs (1) and (3) which have been connected together and those of the FinFETs (6) and (8) which have also been connected together are connected together, thus forming the common source region S (A).

Similarly, a common source region S (B) is formed with the FinFETs (2), (4), (5) and (7).

Although, for convenience of explanation, the common source regions were written as "S (A)" and "S (B)," the sources of the transistors Tr1 and Tr2 are connected together as illustrated in FIG. 3.

It should be noted that connection over a section X shown in FIG. 1 may be made using the activation layers 11 rather than the source electrodes 116 of the FinFETs (1), (3), (6) and (8). The same is true for connection over a section Y shown in FIG. 1.

The transistors Tr1 and Tr2 which are paired and connected in parallel as described above are referred to as one-input-gate paired transistors.

Figure 5:
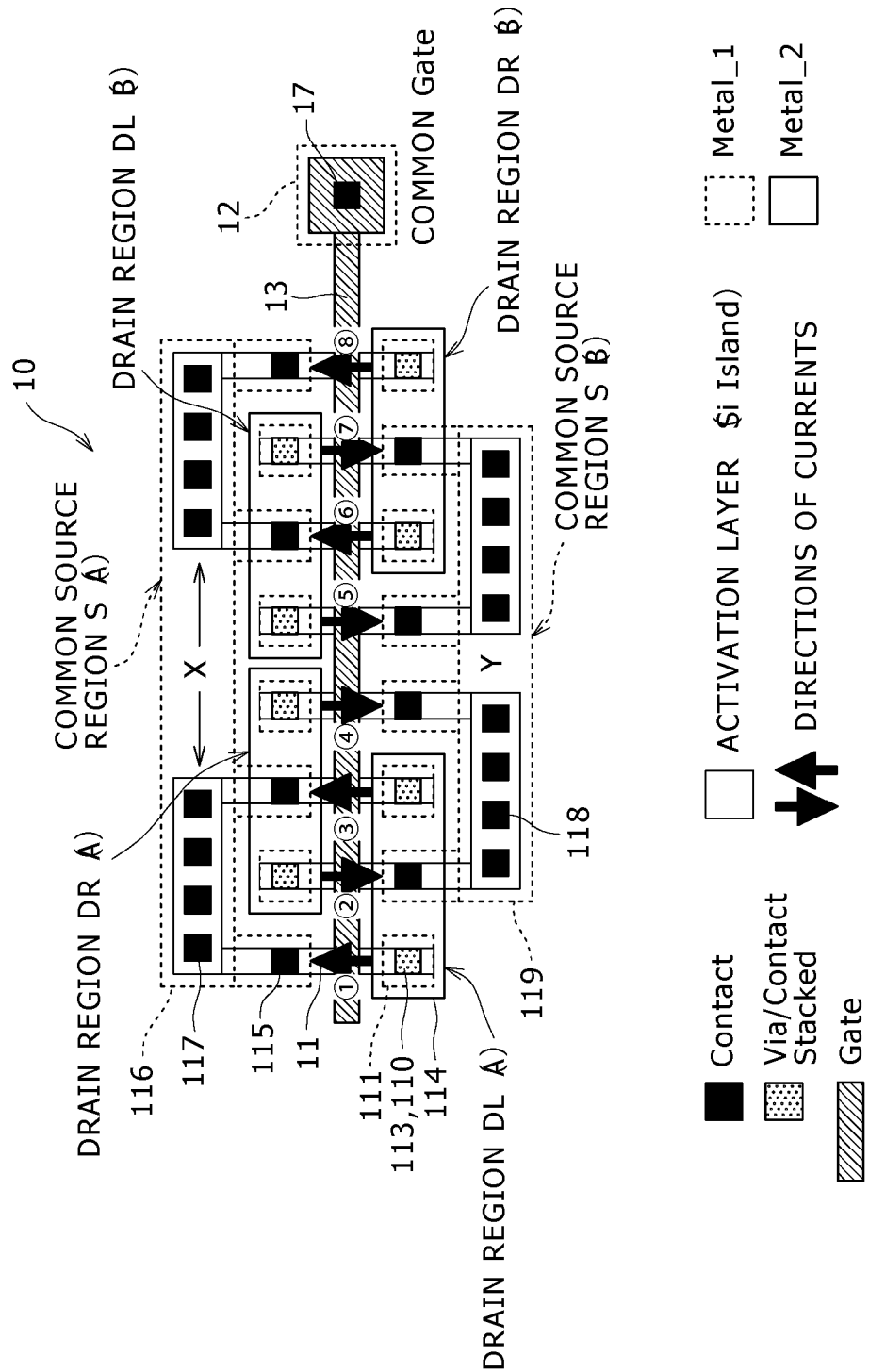
FIG. 5 is a view for describing the operation of the semiconductor device according to the first embodiment.

A description will be given next of the operation of the semiconductor device 10 shown in FIG. 1 with reference to FIG. 5. FIG. 5 is a view for describing the operation of the semiconductor device according to the present embodiment.

If the gate voltage $V_{GS}$ is applied to the gate contact 12, and the voltage $V_{DS}$ between the drain electrodes 114 of the drain regions DL and DR and the common source regions S (A) and S (B) so that a positive voltage is applied to the drain diffusion layer 18 of each of the activation layers 11, a channel will be formed between the source and drain diffusion layers 19 and 18, causing currents ID to flow from the drain diffusion layer 18 to the source diffusion layer 19 (arrows in FIG. 5 indicate the directions of the currents ID).

More specifically, a current ID (1) flows through the FinFET (1), and a current ID (3) through the FinFET (3), both from the drain region DL (A) to the common source region S (A).

A current ID (2) flows through the FinFET (2), and a current ID (4) through the FinFET (4), both from the drain region DR (A) to the common source region S (B).

A current ID (5) flows through the FinFET (5), and a current ID (7) through the FinFET (7), both from the drain region DL (B) to the common source region S (B).

A current ID (6) flows through the FinFET (6), and a current ID (8) through the FinFET (8), both from the drain region DR (B) to the common source region S (A).

However, the direction of the currents ID (1) and ID (3) is opposite to that of the currents ID (5) and ID (7). Similarly, the direction of the currents ID (2) and ID (4) is opposite to that of the currents ID (6) and ID (8).

The arrangement and connection of the FinFETs as illustrated in FIG. 1 ensures matching of the directions of the currents as a whole in the paired transistors made up of the pair of transistors Tr1 and Tr2.

The present embodiment prevents potential impact arising from the process due to the difference in the direction of current flow. This permits arrangement of FinFETs in a waste-free manner, thus providing a small pitch width between the transistors.

Modification Example of the First Embodiment

Figure 6:
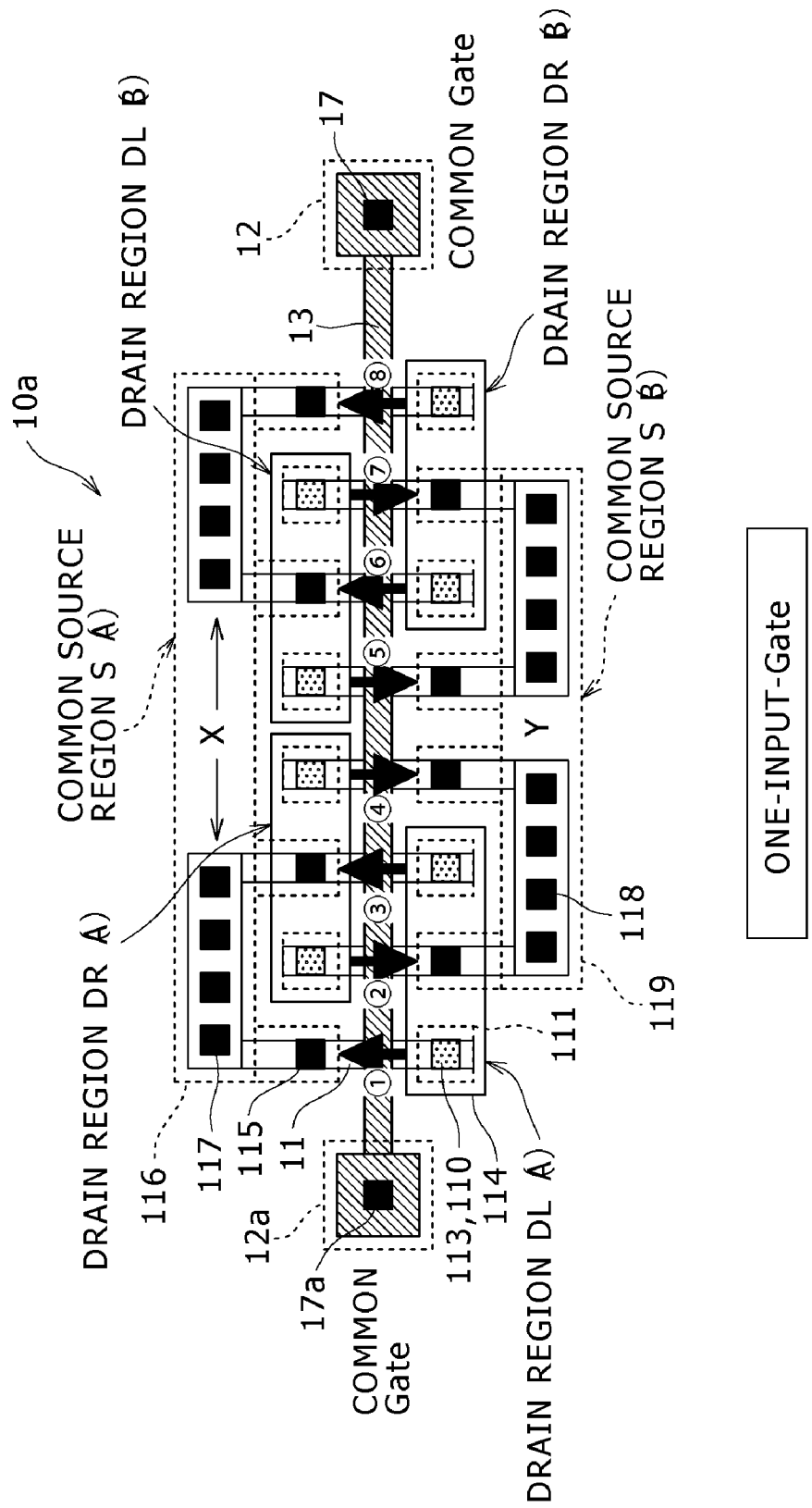
FIG. 6 is a plan view illustrating a modification example of the semiconductor device according to the first embodiment.

A description will be given next of a modification example of the first embodiment. FIG. 6 is a plan view illustrating a modification example of the semiconductor device according to the present embodiment.

As in the case of a semiconductor device 10a shown in FIG. 6, the gate contact 12 and a gate contact 12a may be connected one on each side of the gate electrode 13. As a result, the gate contact 12a is connected to the gate electrode 13 via a contact hole 17b.

In the present embodiment, a case has been described in which the sources and drains of the two FinFETs are connected together. However, the sources and drains of two or more FinFETs may be connected together. In this case, the number of FinFETs crossing the gate electrode 13 is at least 12.

Second Embodiment

Figure 7:
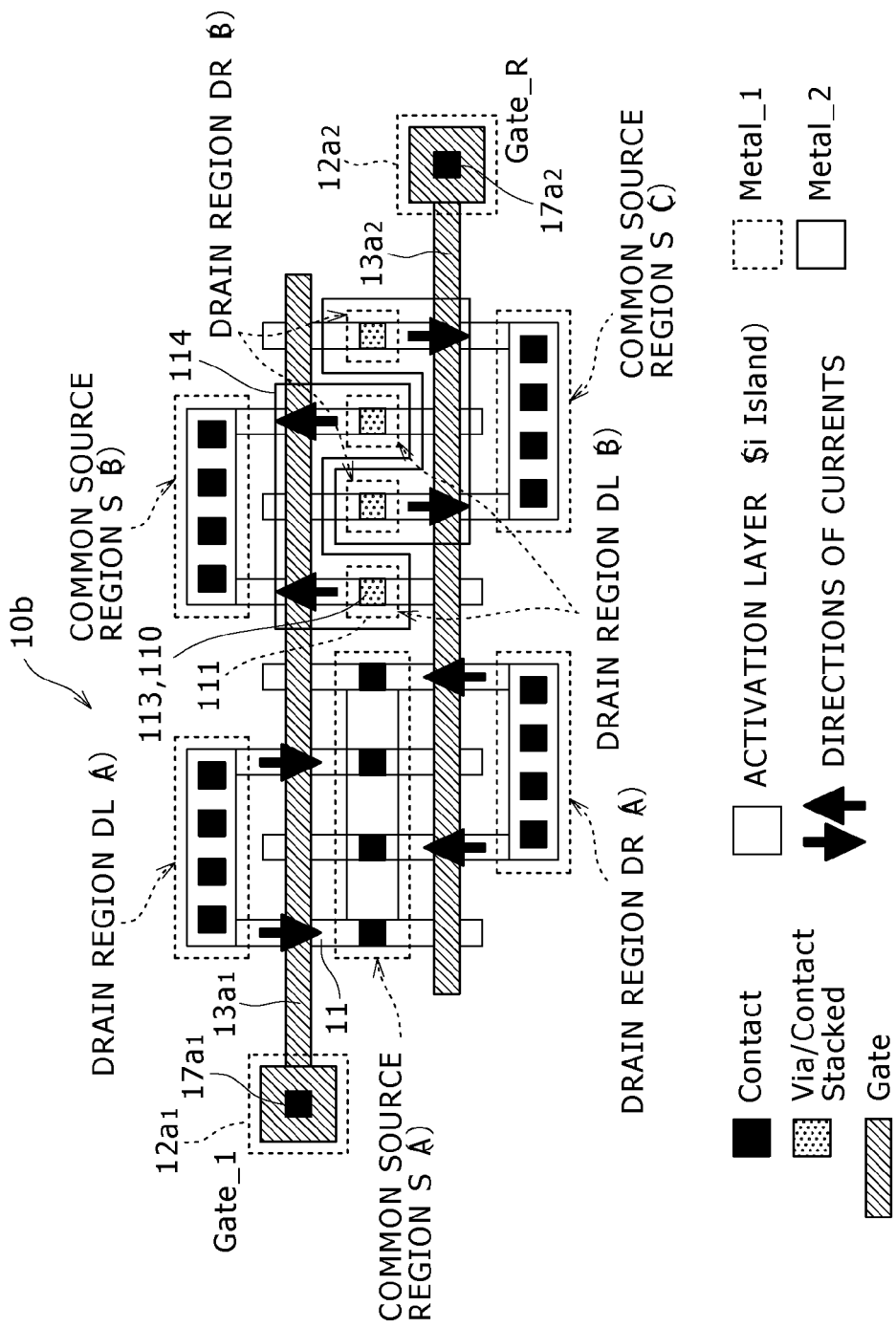
FIG. 7 is a plan view illustrating an example of a semiconductor device according to a second embodiment.
Figure 8:
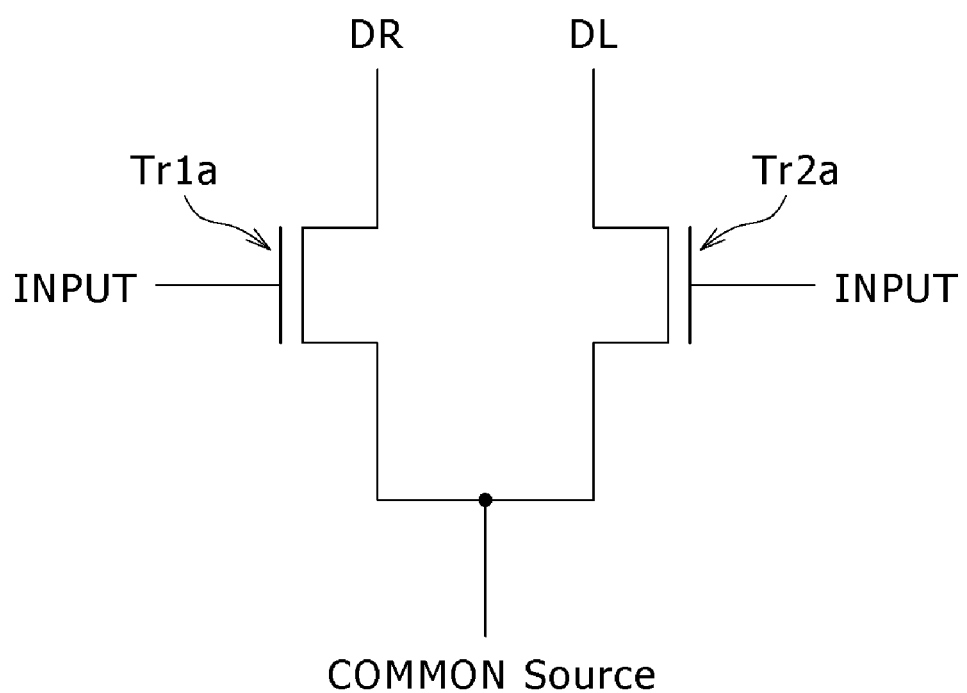
FIG. 8 is an equivalent circuit diagram of the semiconductor device shown in FIG. 7.

FIG. 7 is a plan view illustrating an example of a semiconductor device according to the present embodiment. FIG. 8 is an equivalent circuit diagram of the semiconductor device shown in FIG. 7.

A semiconductor device 10b includes paired transistors which have two gate contacts $12a_1$ and $12a_2$. As illustrated in FIG. 8, the paired transistors control the two gates independently of each other. The present embodiment provides the paired transistors shown in FIG. 8 by providing three common source regions S (A), S (B) and S (C). A description will be given below of the differences of the present embodiment from the first embodiment.

As illustrated in FIG. 8, the transistors Tr1 and Tr2 have their gate inputs independent of each other and are connected in parallel at their source.

More specifically, a transistor Tr1a includes the FinFETs (1), (3), (5) and (7), and a transistor Tr2a the FinFETs (2), (4), (6) and (8).

The drain regions DL (A), DL (B), DR (A) and DR (B) are formed at different locations from those in the first embodiment. However, the FinFETs connected to each of the drain regions are the same as those in the first embodiment.

Unlike in the first embodiment, in order to connect together the sources of the transistors Tr1a and Tr2a shown in FIG. 8, the source electrodes 116 of the FinFETs (1) and (3) which have been connected together and those of the FinFETs (2) and (4) which have also been connected together are connected together, thus forming the common source region S (A).

Similarly, the common source region S (B) is formed with the FinFETs (5) and (7), and the common source region S (C) with the FinFETs (6) and (8).

The arrangement and connection of the FinFETs as illustrated in FIG. 7 allows the sources of the two transistors to be connected together as the source S as illustrated in FIG. 8.

The gate of the transistor Tr1a shown in FIG. 8 is formed by connecting gate electrodes $13a_1$ of the FinFETs (1), (3), (5) and (7) together to the gate contact $12a_1$.

Similarly, the gate of the transistor Tr2a shown in FIG. 8 is formed by connecting gate electrodes $13a_2$ of the FinFETs (2), (4), (6) and (8) together to the gate contact $12a_2$.

The transistors which are paired as described above are referred to as two-input-gate paired transistors.

If the gate voltage $V_{GS}$ is applied to the gate contact 12, and the voltage $V_{DS}$ between the drain electrodes 114 of the drain regions DL (A), DL (B), DR (A) and DR (B) and the common source regions S (A) to S (C) as illustrated in FIG. 7 so that a positive voltage is applied to the drain diffusion layer 18 of each of the activation layers 11, a channel will be formed between the source and drain diffusion layers 19 and 18, causing the currents ID to flow from the drain diffusion layer 18 to the source diffusion layer 19.

More specifically, the currents ID (1) and ID (3) flow from the drain region DL (A) to the common source region S (A), and the currents ID (2) and ID (4) from the drain region DR (A) to the common source region S (A).

The currents ID (5) and ID (7) flow from the drain region DL (B) to the common source region S (B), and the currents ID (6) and ID (8) from the drain region DR (B) to the common source region S (C).

However, the direction of the currents ID (1) and ID (3) is opposite to that of the currents ID (5) and ID (7). Similarly, the direction of the currents ID (2) and ID (4) is opposite to that of the currents ID (6) and ID (8).

The arrangement and connection of the FinFETs as illustrated in FIG. 7 ensures matching of the directions of the currents as a whole in the paired transistors made up of the pair of transistors Tr1a and Tr2a.

The present embodiment prevents potential impact arising from the process due to the difference in the direction of current flow. This permits arrangement of FinFETs in a waste-free manner, thus providing a small pitch width H between the transistors.

Modification Example of the Second Embodiment

Figure 9:
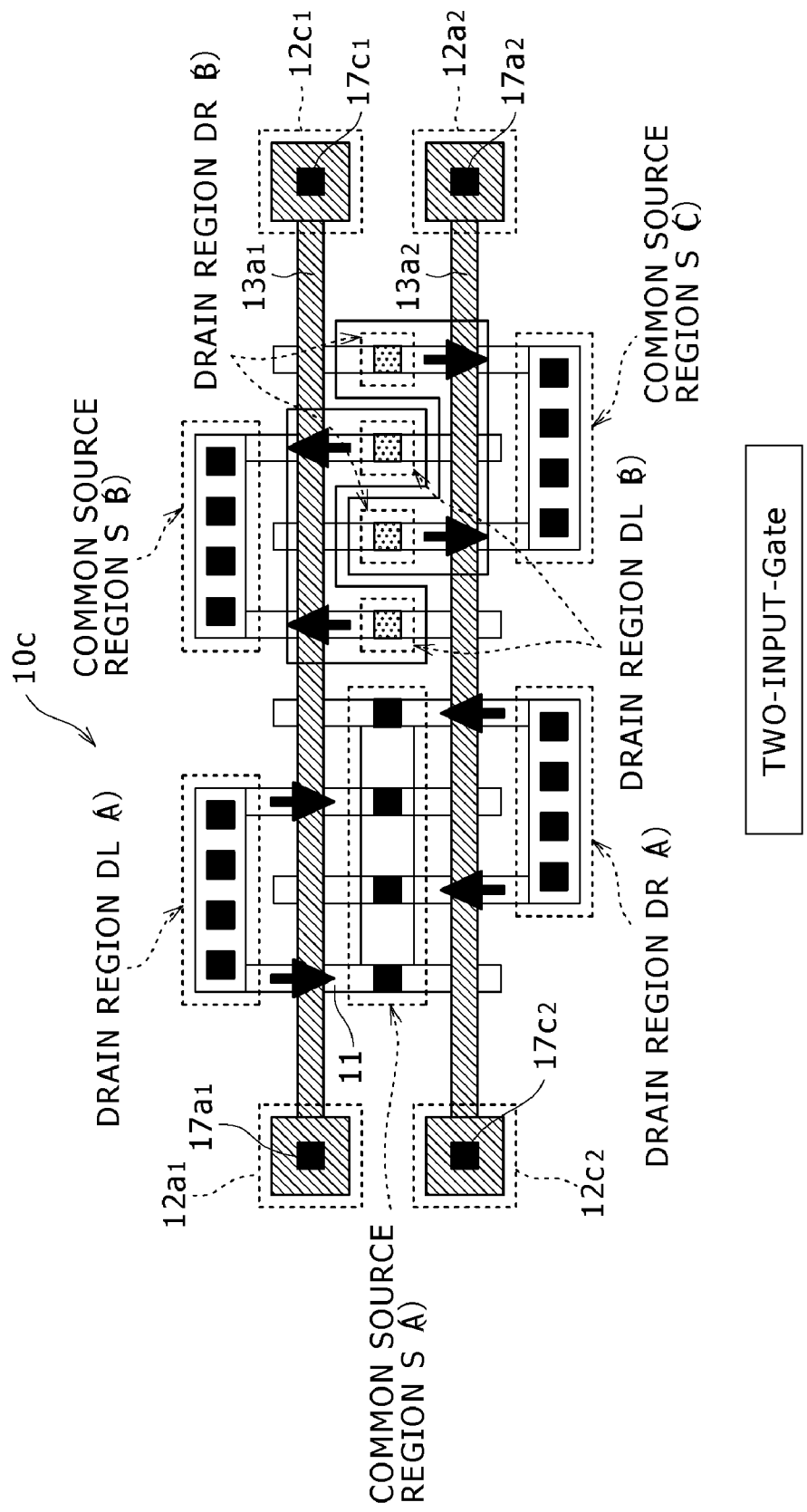
FIG. 9 is a plan view illustrating a modification example of the semiconductor device according to the second embodiment.

A description will be given next of a modification example of the second embodiment. FIG. 9 is a plan view illustrating a modification example of the semiconductor device according to the present embodiment.

As in the case of a semiconductor device 10c shown in FIG. 9, the gate contacts $12a_1$ and $12c_1$ may be connected one on each side of the gate electrode $13a_1$. The gate contacts $12a_2$ and $12c_2$ may be connected one on each side of the gate electrode $13a_2$. As a result, a gate contact $12c_1$ is connected to the gate electrode $13a_1$ via a contact hole $17c_1$, and a gate contact $12c_2$ to the gate electrode $13a_2$ via a contact hole $17c_2$.

Third Embodiment

FIG. 10 is a plan view illustrating an example of a semiconductor device according to the present embodiment. FIG. 11A is a sectional view of the semiconductor device shown in FIG. 1. FIG. 11B is a sectional view of the semiconductor device shown in FIG. 10. It should be noted, however, that the sectional views in FIGS. 11A and 11B are as seen from a direction A shown in FIG. 10 and show only the activation layers 11 on the semiconductor substrate A.

A semiconductor device 10d has dummy activation layers 120a and 120b formed one on each end of the activation layers 11 of the semiconductor device 10 (one-input gate paired transistors) shown in FIG. 1. The dummy activation layers 120a and 120b are formed on the underlying layer of the gate electrode 13 as with the other activation layers 11.

In the absence of the two dummy activation layers 120a and 120b as illustrated in FIG. 11A, the repetition of the patterns of the activation layers 11 is interrupted, thus rendering the patterns of the activation layers 11 (1) and 11 (8) more likely to collapse than the other activation layers due to lithographic causes.

For this reason, the dummy activation layer 120a is formed on one side of the activation layer 11 (1), and the dummy activation layer 120b on one side of the activation layer 11 (8), as illustrated in FIG. 11B. This prevents potential collapse of the patterns of the activation layers 11 (1) and 11 (8) on both ends.

Fourth Embodiment

FIG. 12 is a plan view illustrating an example of a semiconductor device according to the present embodiment.

A semiconductor device 10e has, for the same reason as in the third embodiment, the dummy activation layers 120a and 120b formed one on each end of the activation layers 11 of the semiconductor device 10b (two-input gate paired transistors) shown in FIG. 7. The dummy activation layers 120 are formed on the underlying layer of the gate electrode 13 as with the other activation layers 11.

The present embodiment also prevents potential collapse of the patterns of the activation layers 11 (1) and 11 (8) at both ends by providing the dummy activation layers 120a and 120b as in the third embodiment.

Fifth Embodiment

Figure 13:
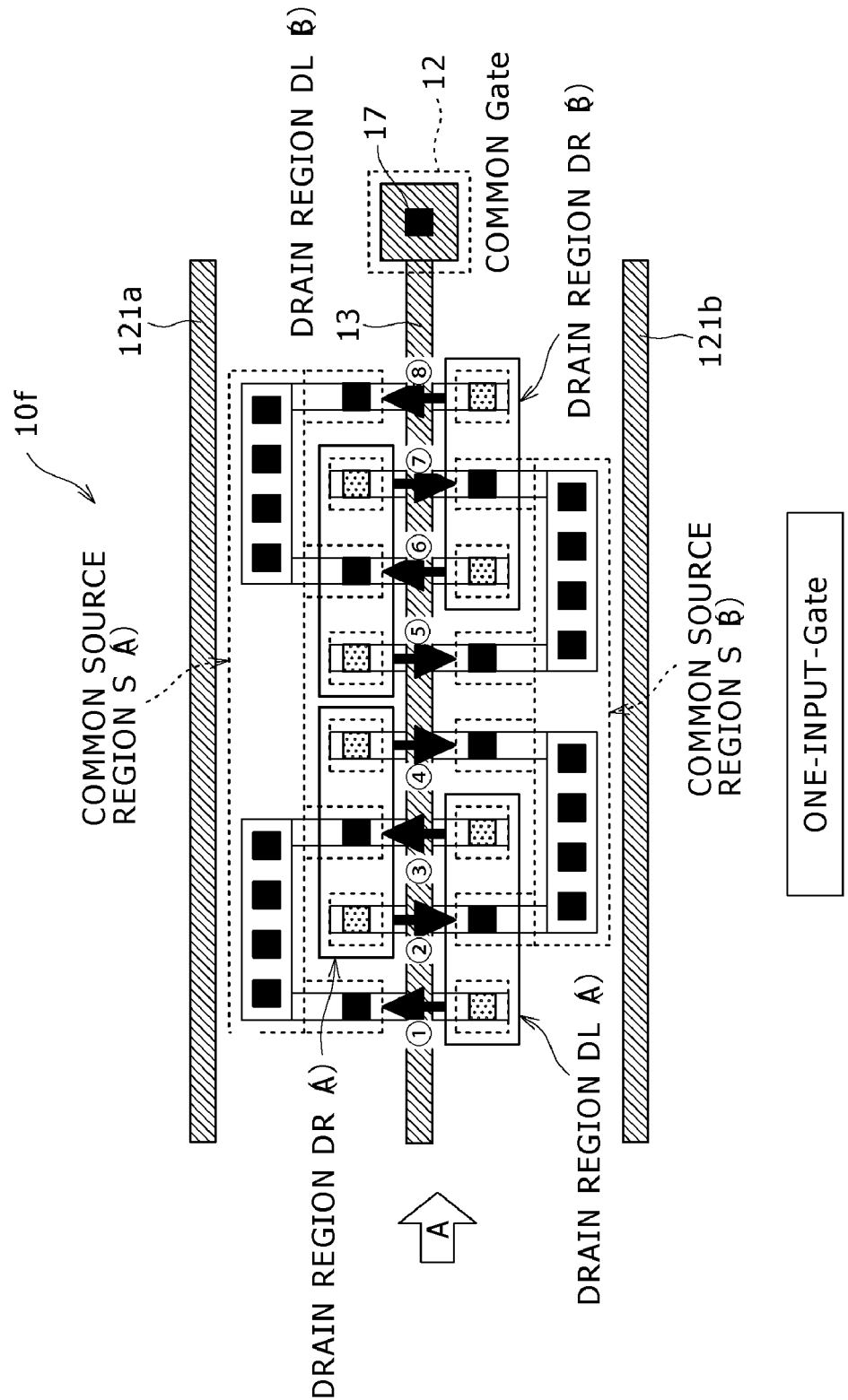
FIG. 13 is a plan view illustrating an example of a semiconductor device according to a fifth embodiment.
Figure 14A:
FIGS. 14A and 14B are sectional views for describing an example of the semiconductor device according to the fifth embodiment.
Figure 14B:
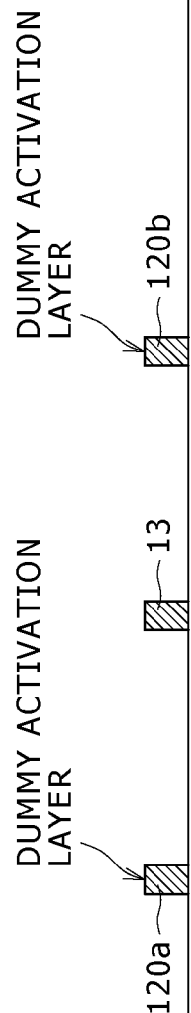

FIG. 13 is a plan view illustrating an example of a semiconductor device according to the present embodiment. FIG. 14A is a sectional view of the semiconductor device shown in FIG. 1. FIG. 14B is a sectional view of the semiconductor device shown in FIG. 13. It should be noted, however, that the sectional views in FIGS. 14A and 14B are as seen from the direction A shown in FIG. 13 and show only the gate electrode 13 on the semiconductor substrate A.

A semiconductor device 10f has dummy gate electrodes 121a and 121b formed in the semiconductor device 10 (one-input gate paired transistors) shown in FIG. 1. The dummy gate electrodes 121a and 121b are formed parallel to the gate electrode 13 and beside the common source regions S (A) and S (B).

In the absence of the two dummy gate electrodes 121a and 121b as illustrated in FIG. 14A, the gate electrode 13 is isolated, thus rendering the pattern likely to collapse due to lithographic causes.

For this reason, the dummy gate electrodes 121a and 121b are formed beside the gate electrode 13 one on each side, as illustrated in FIG. 14B. This prevents potential collapse of the pattern of the gate electrode 13.

Sixth Embodiment

Figure 15:
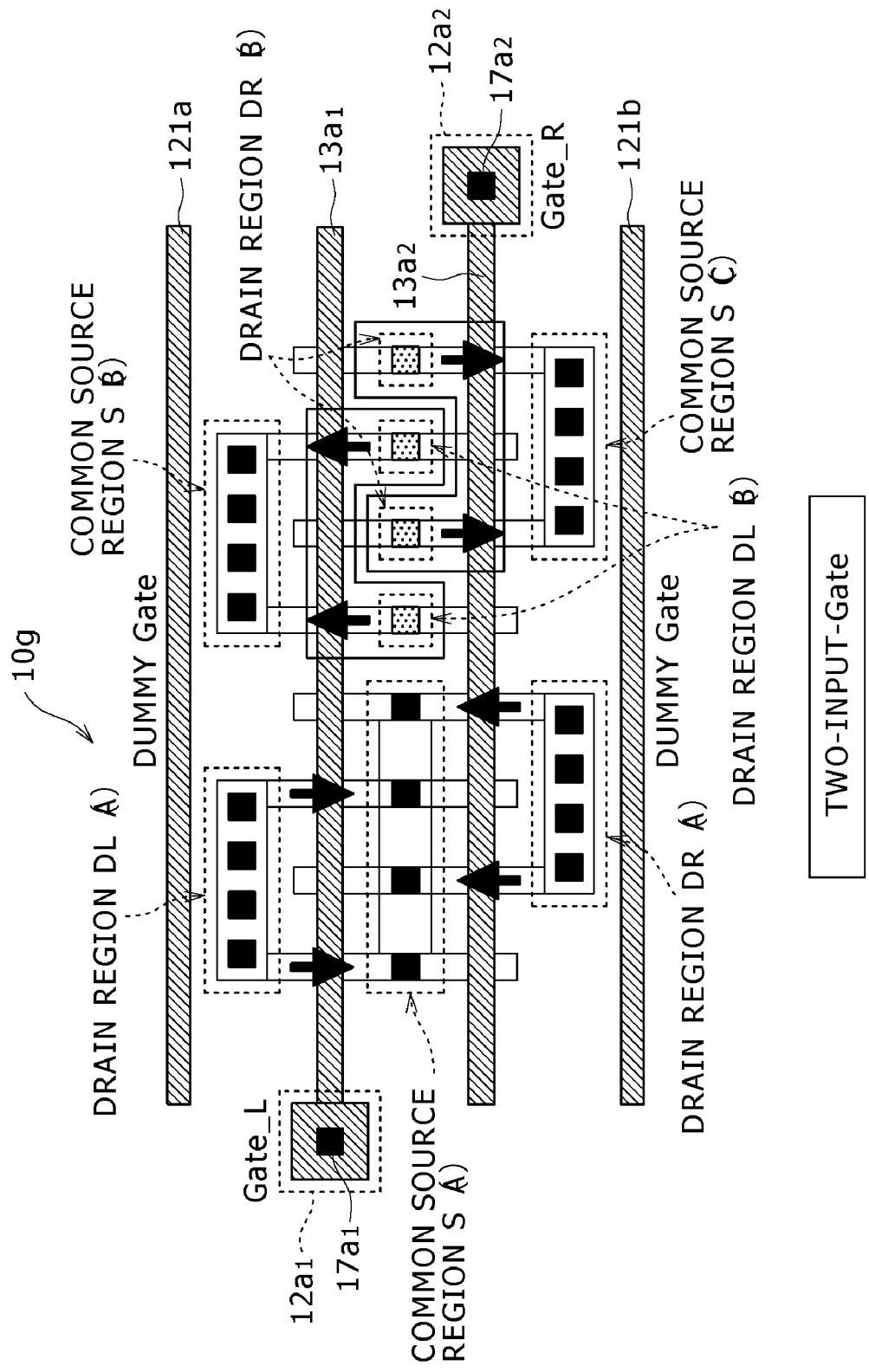
FIG. 15 is a plan view illustrating an example of a semiconductor device according to a sixth embodiment.

FIG. 15 is a plan view illustrating an example of a semiconductor device according to the present embodiment.

A semiconductor device 10g has the dummy gate electrodes 121a and 121b formed in the semiconductor device 10a shown in FIG. 7. The dummy gate electrodes 121a and 121b are formed parallel to the gate electrodes $13a_1$ and $13a_2$ and beside the common source regions S (A) and S (B).

The present embodiment also prevents potential collapse of the patterns of the gate electrodes $13a_1$ and $13a_2$ by providing the dummy gate electrodes 121a and 121b as in the fifth embodiment.

Seventh Embodiment

Figure 16:
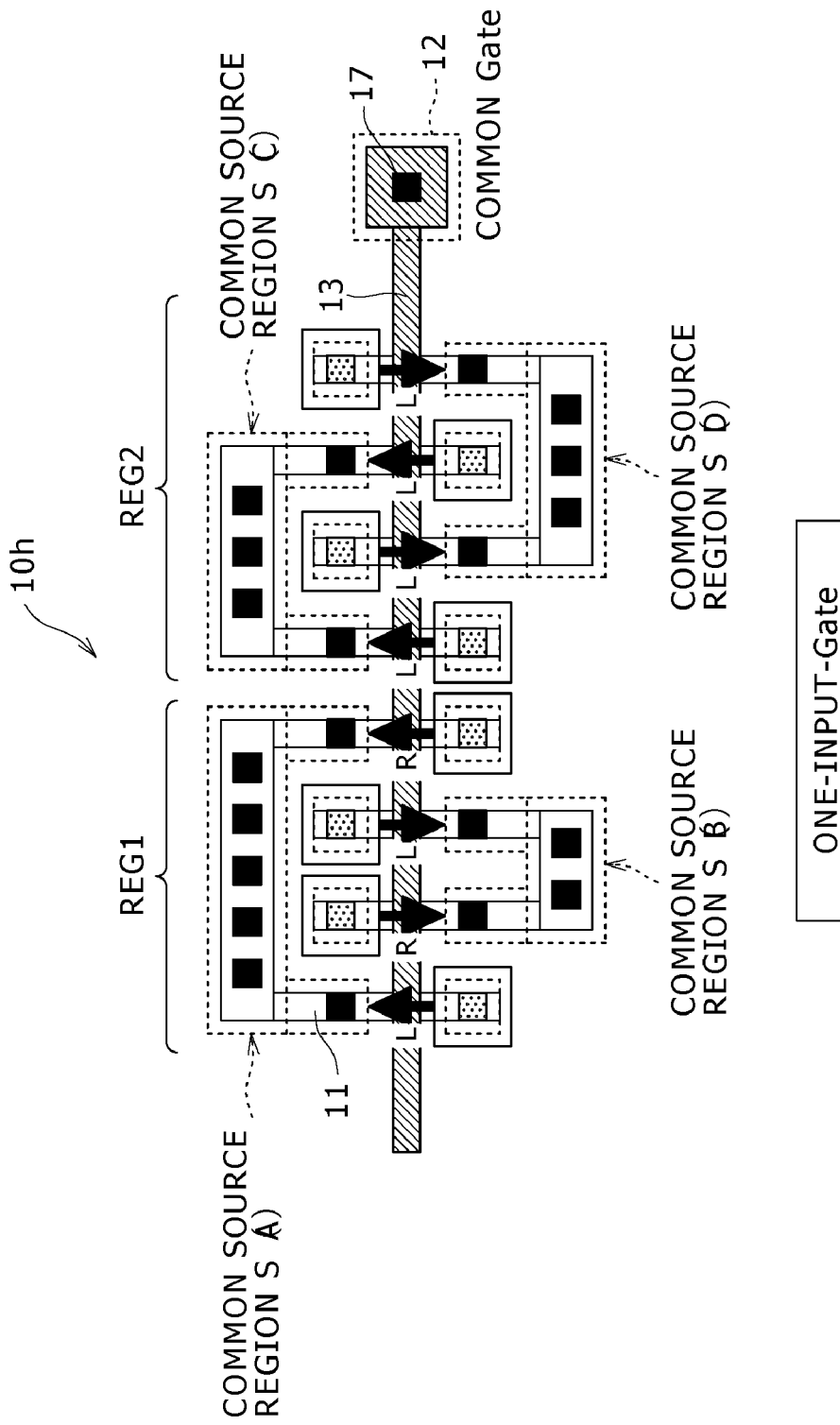
FIG. 16 is a plan view illustrating an example of a semiconductor device according to a seventh embodiment.

FIG. 16 is a plan view illustrating an example of a semiconductor device according to the present embodiment.

In the first to sixth embodiments, the drain region DL (refer to FIG. 3) forming the drain DL of the transistor Tr1 and the drain DR forming the drain DR of the transistor Tr2 are equally sized. Therefore, the transistors Tr1 and Tr2 are also equally sized. However, the number of activation layers 11 cannot be adjusted depending on the arrangement of Fin-FETs. This leads to a case where the size ratio is not 1 to 1. As a result, the currents ID do not cancel each other out in some regions.

For a semiconductor device 10h, a description will be given of how to achieve matching of the directions of the currents as a whole by taking, as an example, one-input-gate paired transistors with the 3:1 size ratio between the transistors Tr1 and Tr2.

In the present embodiment, if the size ratio is 3:1, then the FinFETs are divided into two regions, a region REG1 which includes the FinFETs so that the size ratio is 1:1, and a region REG2 which is larger (or smaller) than the region REG1 and includes the remaining FinFETs.

Reference numeral L shown in FIG. 16 denotes the currents ID flowing from the drain region DL, and reference numeral R the currents ID flowing from the drain region DR. The transistor Tr1 is formed with the FinFETs (1), (3) and (5) to (8). The transistor Tr2 is formed with the FinFETs (2) and (4).

Therefore, the transistors Tr1 and Tr2 are sized differently. However, the size ratio between the two is 1:1 because the FinFETs in the region REG1 form different drain regions from each other, because the FinFETs (1) and (4) form the common source region S (A), and because the FinFETs (2) and (3) form the common source region S (B).

In the region REG2, all the FinFETs form the drain region DL of the transistor Tr1. However, the FinFETs (5) and (7) form the common source region S (C), and the FinFETs (6) and (8) a common source region S (D) in a symmetrical manner so that the polarity of the currents ID flowing from the drain region DL of the transistor Tr1 is 0.

As described above, the arrangement and connection of the FinFETs in consideration of the polarity of the currents ID prevents potential impact arising from the process, thus ensuring matching of the directions of the currents as a whole also in the region REG2.

It should be noted that the present embodiment is preferably applicable even if the size ratio between the transistors Tr1 and Tr2 is 1:4.

Modification Example of the Seventh Embodiment

Figure 17:
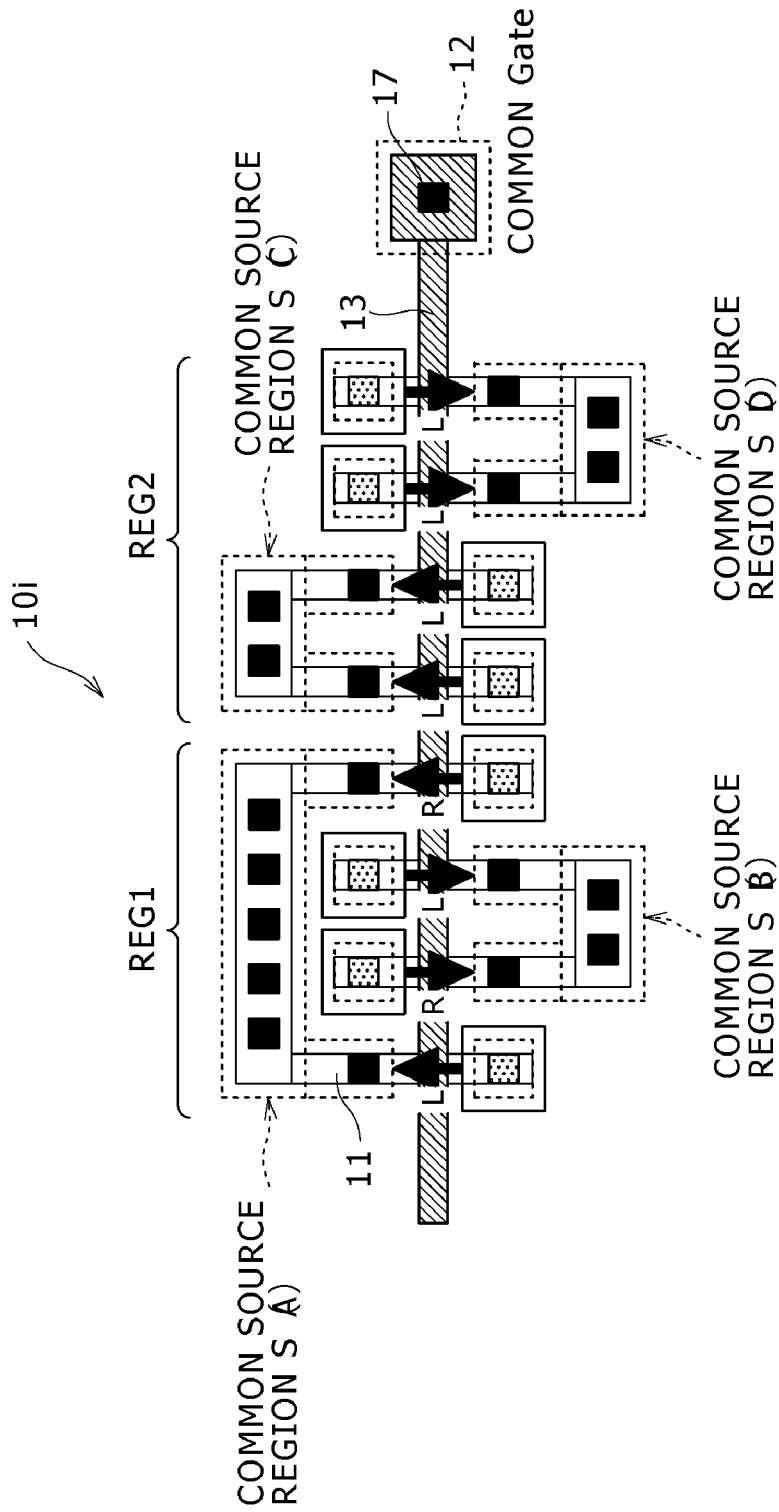
FIG. 17 is a plan view illustrating a modification example of the semiconductor device according to the seventh embodiment.

A description will be given of a modification example of the present embodiment. FIG. 17 is a plan view illustrating a modification example of the semiconductor device according to the present embodiment.

The FinFETs may be arranged and connected in the region REG2 as in a semiconductor device 10i shown in FIG. 17.

More specifically, in the region REG2, the FinFETs (5) and (6) form the common source region S (C), and the FinFETs (7) and (8) the common source region S (D) in a symmetrical manner so that the polarity of the currents ID flowing from the drain region DL of the transistor Tr1 is 0.

The arrangement and connection of the FinFETs as illustrated in FIGS. 16 and 17 ensures matching of the directions of the currents as a whole in the paired transistors not having a 1:1 size ratio between the two transistors.

Eighth Embodiment

Figure 18:
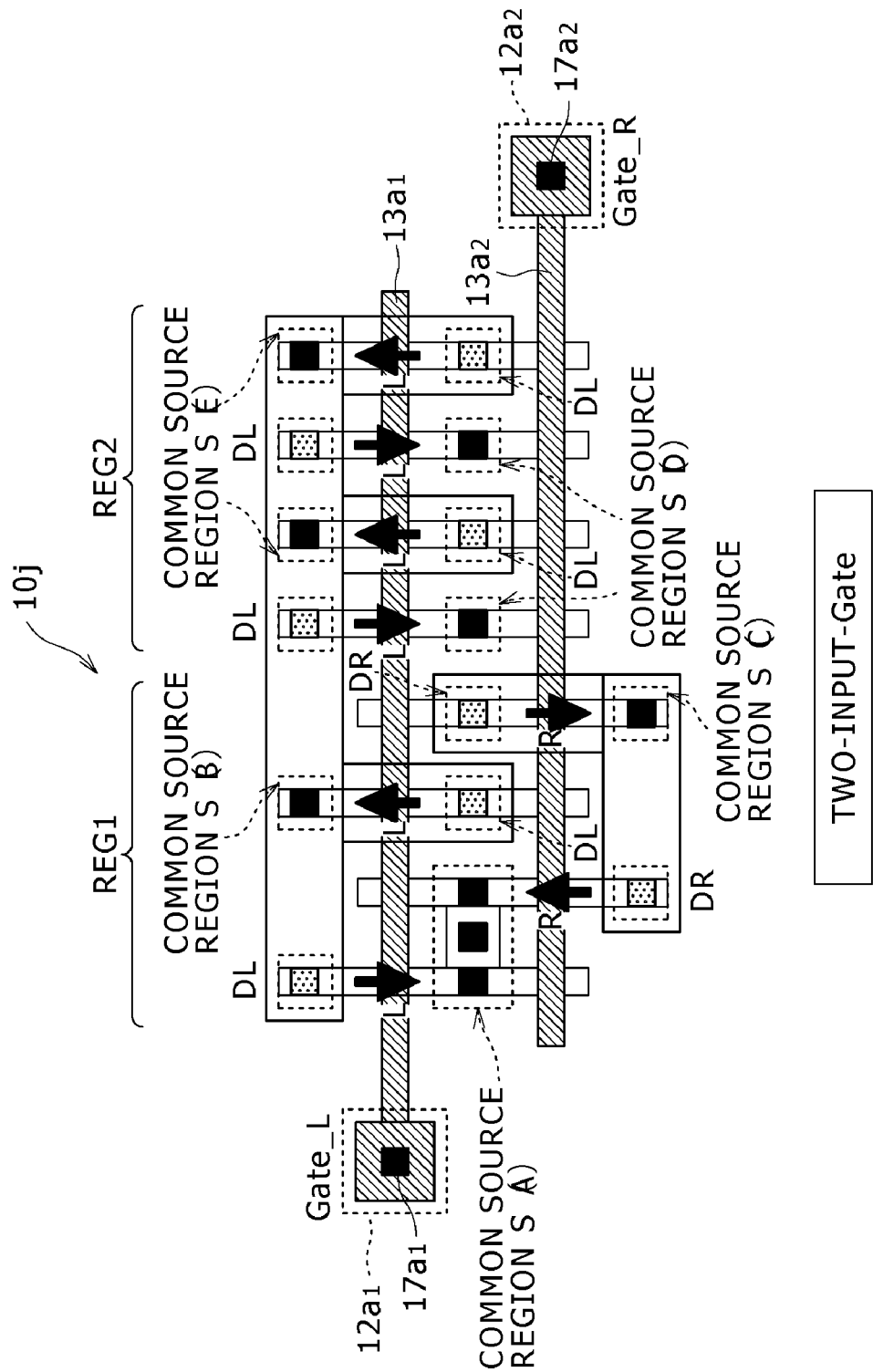
FIG. 18 is a plan view illustrating an example of a semiconductor device according to an eighth embodiment.

FIG. 18 is a plan view illustrating an example of a semiconductor device according to the present embodiment.

The present embodiment will be described taking as an example two-input-gate paired transistors in which the size ratio between the drain regions DL and DR is 3:1 as in the seventh embodiment.

As illustrated in FIG. 18, the transistor Tr1a is formed with the FinFETs (1), (3) and (5) to (8), and the transistor Tr2a with the FinFETs (2) and (4).

In the region REG1, the FinFETs form different drain regions from each other. The FinFETs (1) and (2) form the common source region S (A). The FinFET (3) forms the common source region S (B). The FinFET (4) forms the common source region S (C).

In the region REG2, all the FinFETs form the same drain region DL. The FinFETs (5) and (7) form the common source region S (D), and the FinFETs (6) and (8) a common source region S (E) in a symmetrical manner so that the polarity of the currents ID flowing from the drain region DL of the transistor Tr1a is 0.

As described above, the arrangement and connection of the FinFETs in consideration of the polarity of the currents ID prevents potential impact arising from the process, thus ensuring matching of the directions of the currents as a whole also in the region REG2.

Modification Example of the Eighth Embodiment

Figure 19:
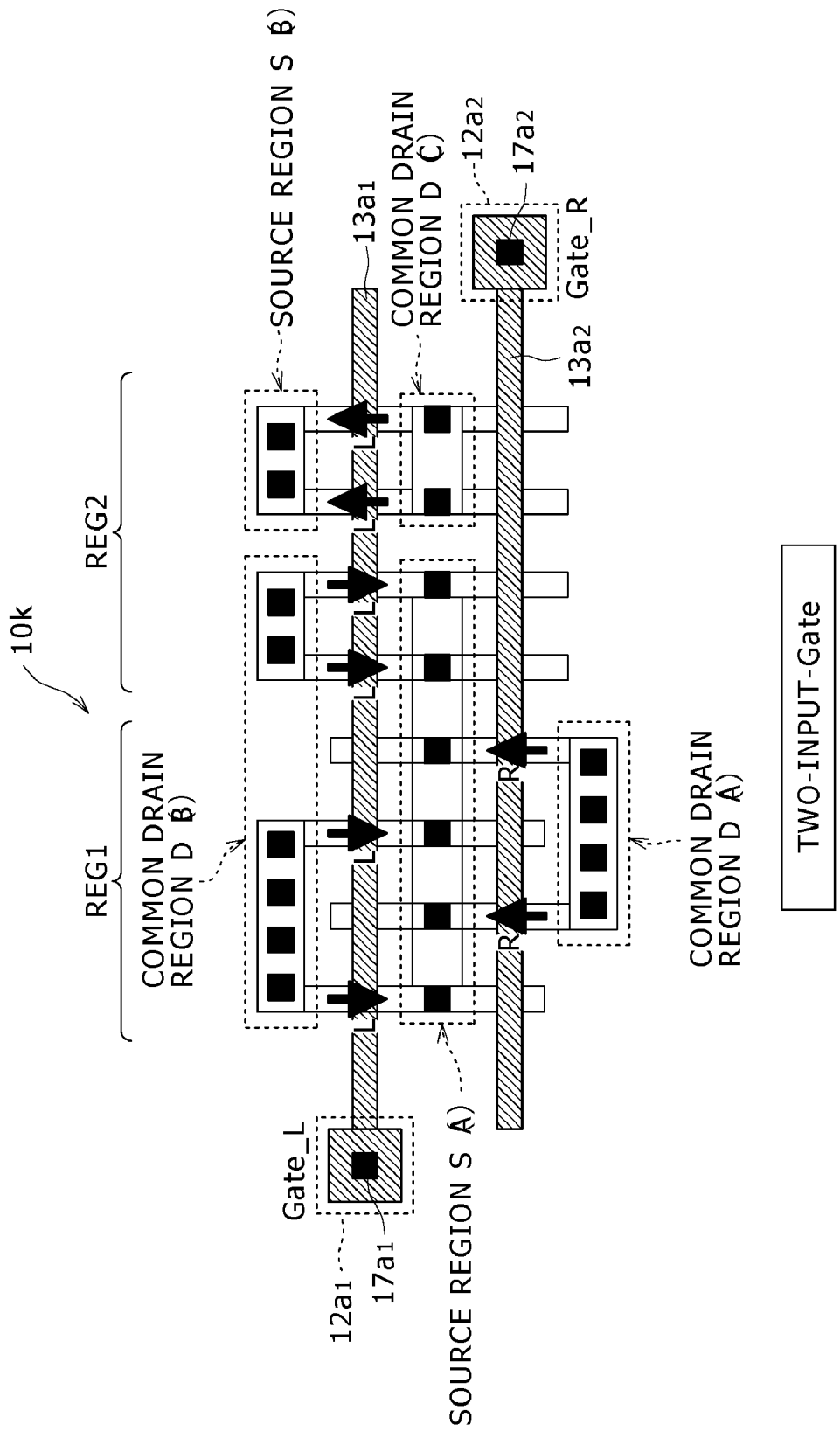
FIG. 19 is a plan view illustrating a modification example of the semiconductor device according to the eighth embodiment.

A description will be given below of a modification example of the present embodiment. FIG. 19 is a plan view illustrating a modification example of the semiconductor device according to the present embodiment.

The FinFETs may be arranged and connected in the region REG2 as in a semiconductor device 10k shown in FIG. 19.

More specifically, in the region REG1, the FinFETs are arranged and connected in the same manner as the FinFETs (1) to (4) shown in FIG. 7.

In the region REG2, the FinFETs (5) and (6) form the common source region S (A) and a common drain region D (B) of the region REG1, and the FinFETs (7) and (8) the common source region S (B) and a drain region D (C) in a symmetrical manner so that the polarity of the currents ID flowing from the drain region DL of the transistor Tr1a is 0.

The arrangement and connection of the FinFETs as illustrated in FIGS. 18 and 19 prevents potential impact arising from the process, thus ensuring matching of the directions of the currents as a whole in the paired transistors not having a 1:1 size ratio between the two transistors.

Ninth Embodiment

Figure 20:
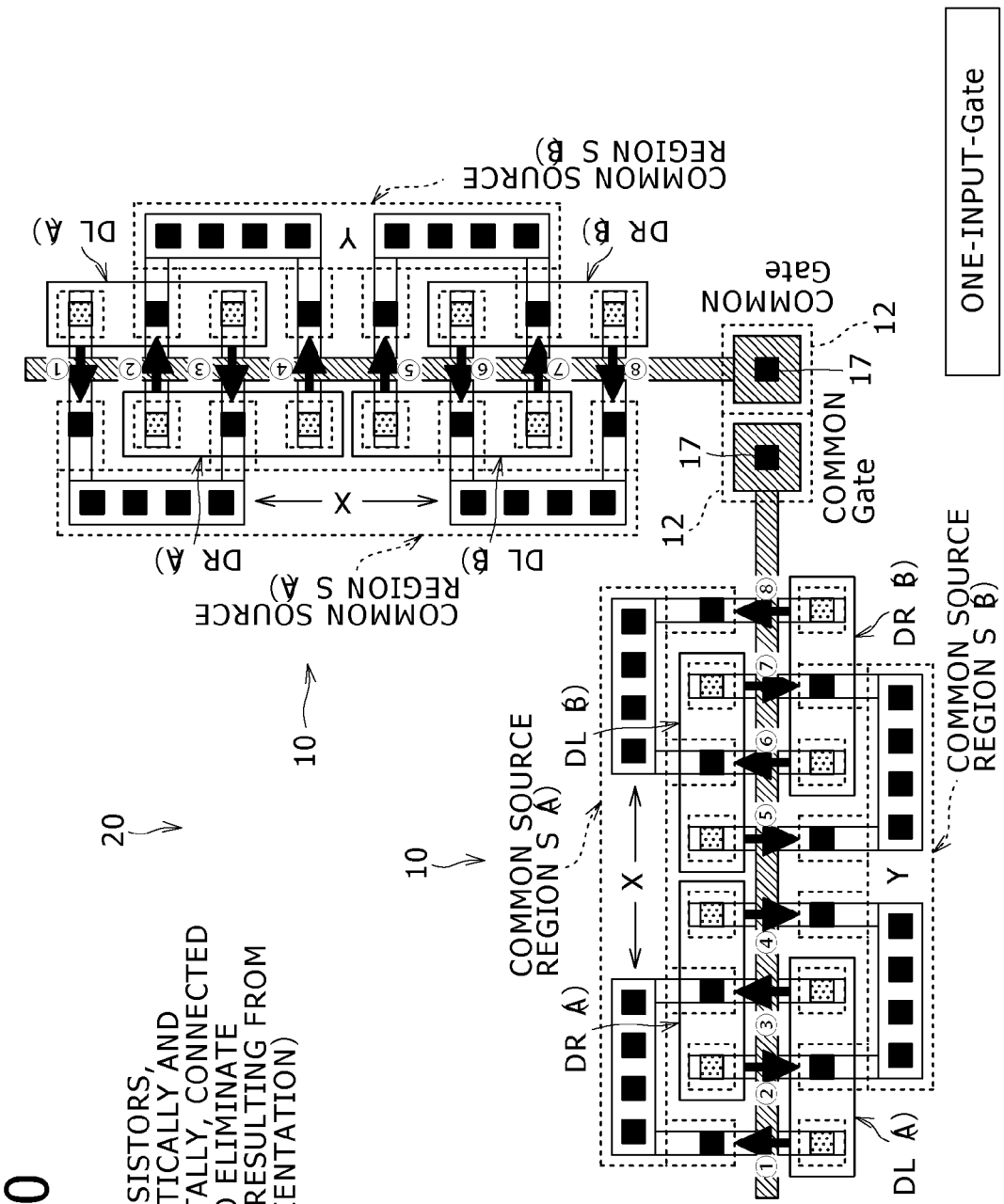
FIG. 20 is a plan view illustrating an example of a semiconductor device according to a ninth embodiment.
Figure 21A:
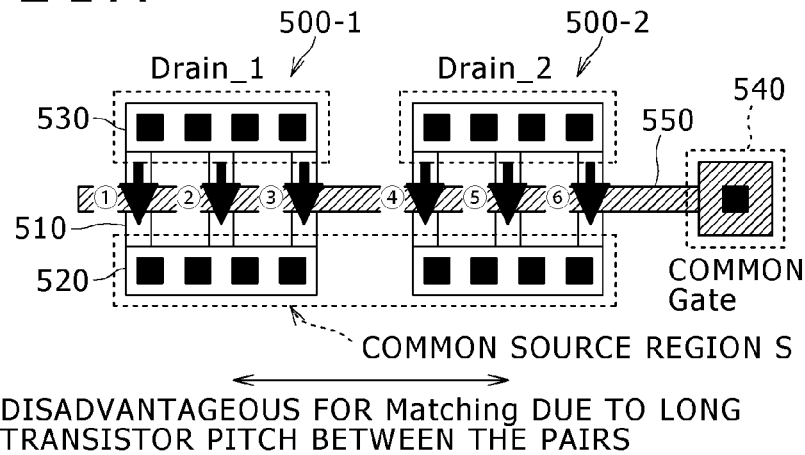
FIGS. 21A to 21C are views illustrating an example of one-input-gate paired transistors.
Figure 21B:
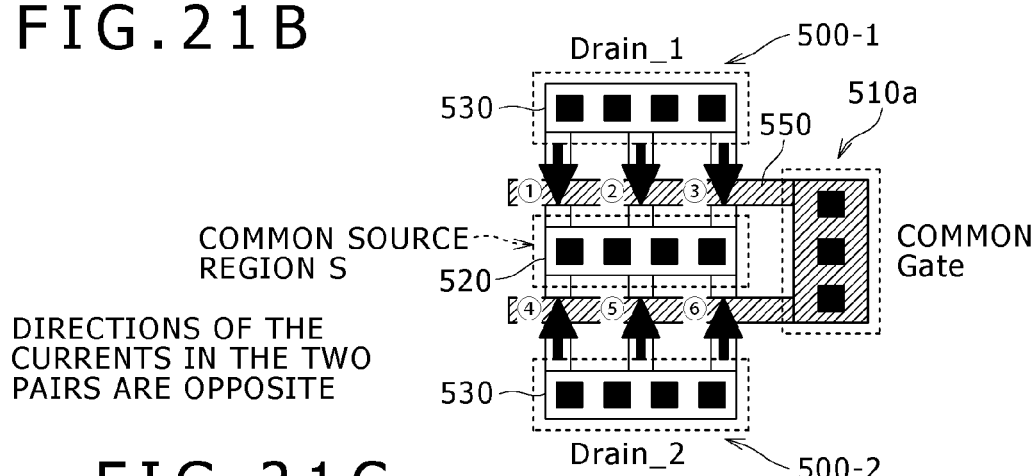
Figure 21C:
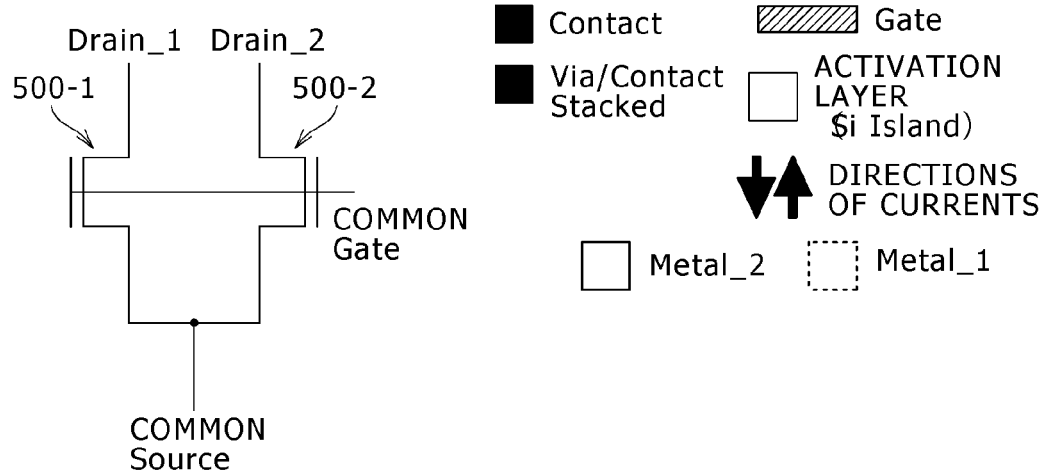
Figure 22A:
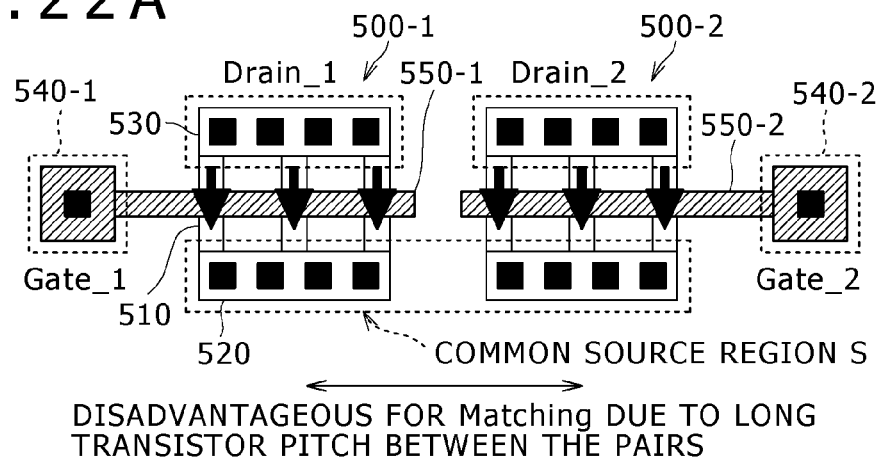
FIGS. 22A to 22C are views illustrating an example of two-input-gate paired transistors.
Figure 22B:
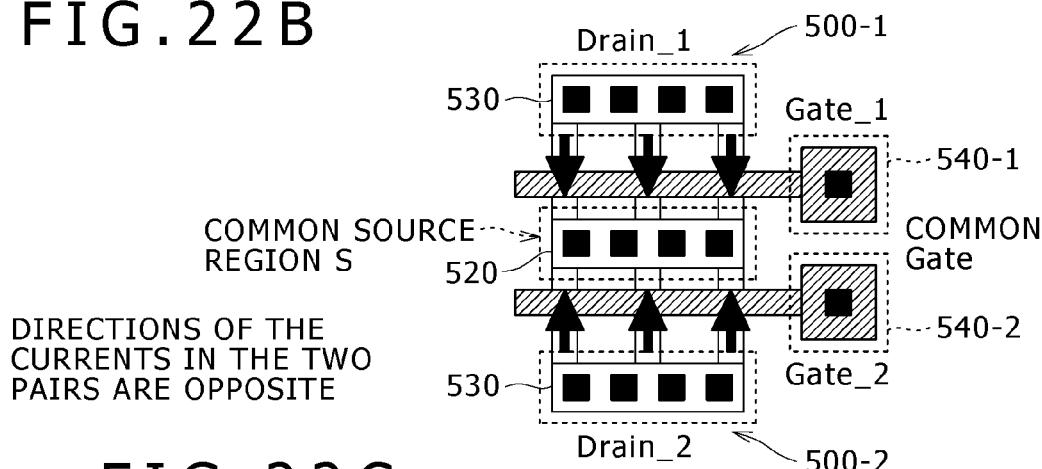
Figure 22C:
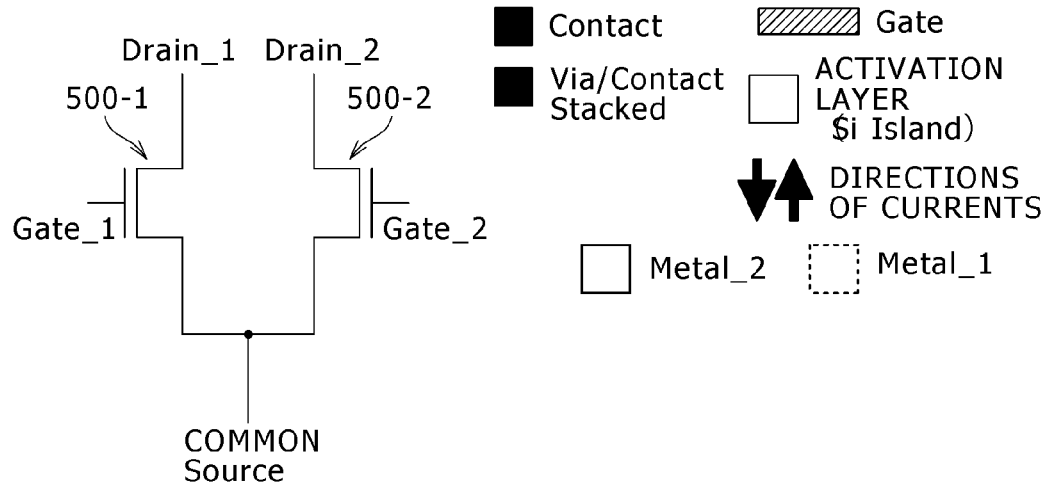

FIG. 20 is a plan view illustrating an example of a semiconductor device according to the present embodiment.

In the present embodiment, the two semiconductor devices 10 shown in FIG. 1 are arranged in such a manner as to provide reduced impact arising from the substrate orientation.

More specifically, a semiconductor device 20 shown in FIG. 20 is formed on a semiconductor substrate so that the fin activation layers 11 forming the paired transistors included in the semiconductor devices 10 are oriented perpendicular to each other.

Such an arrangement provides reduced impact arising from the substrate orientation caused by currents.

In the present embodiment, a semiconductor device having one-input-gate paired transistors was taken as an example. However, the present embodiment may also be applied to a semiconductor device having two-input-gate paired transistors, dummy activation layers or dummy wiring layers. Therefore, various combinations are possible.

Thus, the semiconductor device according to the present embodiment includes the first and second transistors Tr1 and Tr2. Each of the first and second transistors is formed with a plurality of fin transistors. The first and second transistors are connected in parallel to electrically share a source. The plurality of fin transistors FinFETs each include a fin activation layer 11. The fin activation layer 11 protrudes from the semiconductor substrate A. The source diffusion layer 19 serving as the source is formed on one end, and the drain diffusion layer 18 on the other end of the fin activation layer 11 so as to form a channel region.

The fin activation layers 11 are arranged adjacent to each other in parallel. The drain layers DL and DR are disposed so that the currents flow through the plurality of fin transistors FinFETs in opposite directions between the first and second transistors Tr1 and Tr2. This not only permits arrangement of FinFETs in a waste-free manner but also provides a small pitch width between the activation layers.

As a result, it is possible to eliminate potential impact arising from the process due to the directions of current flows between transistors forming the paired transistors, thus providing improved matching.

It should be noted that the arrangement and connection of the FinFETs is not limited to the above embodiments, but may be modified within the scope of the present invention.

It should be understood by those skilled in the art that various modifications, combinations, sub-combinations and alterations may occur depending on design requirements and other factor in so far as they are within the scope of the appended claims or the equivalents thereof.

What is claimed is:

1. A semiconductor device including a transistor pair having one input gate, the transistor pair comprising a first transistor and a second transistor each of which is comprised of a plurality of fin transistors, wherein:

the fin transistors are positioned along a row and the first transistor is comprised of odd-numbered fin transistors and the second transistor is comprised of even-number transistors, sources of the and the second transistor are commonly connected, gates of the first transistor and the second transistor are commonly connected;

each fin transistor has a fin active layer protruding above a semiconductor substrate;

each fin active layer has a source region provided in a surface region of the fin active layer and a drain region provided in a position in the surface region apart from the source area such that a channel region can be formed;

the fin active layers are arranged in a row at constant intervals such that currents flowing through the respective channel regions between the source regions and the drain regions of the fin active layers are parallel to each other, the fin active layers having the same or substantially the same size;

each of the first transistor and the second transistor is formed by 2m (m represents 2 or a greater integer) fin active layers, and the transistor pair a whole is formed by 4m fin active layers;

the drain region and the source region are disposed in each of the fin active layers forming the first transistor such that the direction of the current flowing through each of the channel regions of the first to (2m−1)-th fin active layers is opposite to the direction of the current flowing through each of the channel regions of the (2m+1)-th to (4m−1)-th fin active layers;

the drain region and the source region are disposed in each of the fin active layers forming the second transistor such that the direction of the current flowing through each of the channel regions of the second to 2m-th fin active layers is opposite to the direction of the current flowing through each of the channel regions of the (2m+2)-th to 4m-th fin active layers;

the drain regions of the fin active layers forming the first transistor are commonly connected;

the drain regions of the fin active layers forming the second transistor are commonly connected; and the source regions of the fin active layers are commonly connected.

2. A semiconductor device according to claim 1, wherein:

each of the fin transistors has a gate electrode provided on the fin active layer between the source region and the drain region with an insulation film interposed; and the gate electrodes are commonly connected such that they extend in the direction in which the fin active layers are arranged.

3. A semiconductor device including a transistor pair having two input gates, the transistor pair comprising first transistor and a second transistor each of which is comprised of fin transistors, wherein:

the fin transistors are positioned along a row and the first transistor is comprised of odd-numbered fin transistors and the second transistor is comprised of even-numbered transistors, sources of the first transistor and the second transistor are commonly connected;

each fin transistor has a fin active layer protruding above a semiconductor substrate;

each fin active layer has a source region provided in a surface region of the fin active layer and a drain region provided in a position in the surface region apart from the source region such that a channel region can be formed;

the fin active layers are arranged in a row at constant intervals such that currents flowing through the respective channel regions between the source regions and the drain regions of the fin active layers are parallel to each other, the fin active layers having the same or substantially the same size;

each of the first transistor and the second transistor is formed by 2m (m represents 2 or a greater integer) fin active layers, and the transistor pair as a whole is formed by 4m fin active layers;

the drain region and the source region are disposed in each of the fin active layers forming the first transistor such that the direction of the current flowing through each of the channel regions of the first to (2m−1)-th fin active layers is opposite to the direction of the current flowing through each of the channel regions of the (2m+1)-th to (4m−1)-th fin active layers;

the drain region and the source region are disposed in each of the fin active layers forming the second transistor such that the direction of the current flowing through each of the channel regions of the second to 2m-th fin active layers is opposite to the direction of the current flowing through each of the channel regions of the (2m+2)-th to 4m-th fin active layers;

the drain regions of the fin active layers forming the first transistor are commonly connected;

the drain regions of the fin active layers forming the second transistor are commonly connected; and the source regions of the fin active layers are commonly connected.

4. A semiconductor device according to claim 3, wherein:

each of the fin transistors has a gate electrode provided on the fin active layer between the source region and the drain region with an insulation film interposed;

the gate electrodes of the fin transistors forming the first transistor are commonly connected such that they extend in the direction in which the fin active layers are arranged; and the gate electrodes of the fin transistors forming the second transistor are commonly connected such that they extend in the direction in which the fin active layers are arranged.

5. A semiconductor device according to claim 1, comprising a first dummy active layer and a second dummy active layer electrically isolated from the fin active layers, provided for maintaining the form of the fin active layers, wherein:

the first dummy active layer is disposed parallel to the fin active layer disposed on one end and disposed in the direction opposite to the fin active layers with respect to the fin active layer disposed on the end when viewed in the direction in which the fin active layers are arranged; and the second dummy active layer is disposed parallel to the fin active layer disposed on another end and disposed in the direction opposite to the fin active layers with respect to the fin active layer disposed on the other end when viewed in the direction in which the fin active layers are arranged.

6. A semiconductor device according to claim 2, comprising a first dummy gate electrode and a second dummy gate electrode electrically isolated from the fin active layers, provided for maintaining the form of the gate electrodes, wherein, each of the first and second dummy gate electrodes is disposed parallel to the direction in which the gate electrodes extend such that they sandwich the fin transistors.

7. A semiconductor device including a transistor pair having one input gate, the transistor pair comprising by a first transistor and a second transistor each of which is comprised of fin transistors, wherein:

sources of the first transistor and the second transistor are commonly connected gates of the first transistor and the second transistor are commonly connected;

each fin transistor has a fin active layer protruding above a semiconductor substrate;

each fin active layer has a source region provided in a surface region of the fin active layer and a drain region provided in a position in the surface region apart from the source area such that a channel region can be formed;

the fin active layers are arranged in a row at constant intervals such that currents flowing through the respective channel regions between the source regions and the drain regions of the fin active layers are parallel to each other, the fin active layers having the same or substantially the same size;

the size of the first transistor is different from the size of the second transistor;

the number of fin active layers to form the first transistor included in the fin active layers is greater than the number of fin active layers to form the second transistor;

the fin active layers are grouped into a first group including fin active layers to form the first transistor and fin active layers to form the second transistor in the same quantity and a second group formed by the rest of the fin active layers or the fin active layers excluded from the first group, the second group including an even number of the fin active layers;

the second group is constituted by the fin active layers to form the first transistor;

the drain region and the source region are disposed in each of the fin active layers of the first group to provide the fin active layers to form the first transistor such that the first transistor will be provided with channel regions having a current flowing in a first direction and channel regions having a current flowing in a second direction opposite to the first direction in the same quantity and to provide the fin active layers to form the second transistor such that the second transistor will be provided with channel regions having a current flowing in the first direction and channel regions having a current flowing in the second direction in the same quantity, the fin active layers for the first transistor and the fin active layers for the second transistor included in the first group being alternately disposed;

the drain region and the source region are provided in each of the fin active layers of the second group to provide the fin active layers to form the first transistor such that the first transistor will be provided with channel regions having a current flowing in;

the first direction and channel regions having a current flowing in the second direction in the same quantity;

the drain regions of the fin active layers to form the first transistor included in the first group and the drain regions of the fin active layers to form the first transistor included in the second group are commonly connected;

the drain regions of the fin active layers to form the second transistor included in the first group are commonly connected; and the source regions of the fin active layers are commonly connected.

8. A semiconductor device according to claim 7, wherein:
each of the fin transistors includes a gate electrode provided on the fin active layer between the source region and the drain region with an insulation film interposed; and the gate electrodes are commonly connected such that they extend in the direction in which the fin active layers are arranged.

9. A semiconductor device including a transistor pair having two input gates, the transistor pair comprising a first transistor and a second transistor each of which is comprised of fin transistors,
wherein:
sources of the first transistor and the second transistor formed by fin transistors are commonly connected;
each fin transistor has a fin active layer protruding above a semiconductor substrate;

each fin active layer has a source region provided in a surface region of the fin active layer and a drain region provided in a position in the surface region apart from the source region such that a channel region can be formed;

the fin active layers are arranged in a row at constant intervals such that currents flowing through the respective channel regions between the source regions and the drain regions of the fin active layers are parallel to each other, the fin active layers having the same or substantially the same size;

the size of the first transistor is different from the size of the second transistor;

the number of fin active layers to form the first transistor included in the fin active layers is greater than the number of fin active layers to form the second transistor;

the fin active layers are grouped into a first group including fin active layers to form the first transistor and fin active layers to form the second transistor in the same quantity and a second group formed by the rest of the fin active layers or the fin active layers excluded from the first group, the second group including an even number of the fin active layers;

the second group is constituted by the fin active layers to form the first transistor;

the drain region and the source region are disposed in each of the fin active layers of the first group to provide the fin active layers to form the first transistor such that the first transistor will be provided with channel regions having a current flowing in a first direction and channel regions having a current flowing in a second direction opposite to the first direction in the same quantity and to provide the fin active layers to form the second transistor such that the second transistor will be provided with channel regions having a current flowing in the first direction and channel regions having a current flowing in the second direction in the same quantity, the fin active layers for the first transistor and the fin active layers for the second transistor included in the first group being alternately disposed;

the drain region and the source region are provided in each of the fin active layers of the second group to provide the fin active layers to form the first transistor such that the first transistor will be provided with channel regions having a current flowing in the first direction and channel regions having a current flowing in the second direction in the same quantity;

the drain regions of the fin active layers to form the first transistor included in the first group and the drain regions of the fin active layers to form the first transistor included in the second group are commonly connected;

the drain regions of the fin active layers to form the second transistor included in the first group are commonly connected; and the source regions of the fin active layers are commonly connected.

10. A semiconductor device according to claim 9, wherein:
each of the fin transistors includes a gate electrode provided on the fin active layer between the source region and the drain region with an insulation film interposed;
the gate electrodes of the fin transistors forming the first transistor are commonly connected such that they extend in the direction in which the fin active layers are arranged; and the gate electrodes of the fin transistors forming the second transistor are commonly connected such that they extend in the direction in which the fin active layers are arranged.

11. A semiconductor device according to claim 1 comprising a plurality of transistor pairs, wherein a first transistor pair and a second transistor pair among the plurality of transistor pairs are disposed on the semiconductor substrate such that the direction in which the fin active layers included in the first transistor pair are arranged and the direction in which the fin active layers included in the second transistor pair are arranged are orthogonal to each other.

* * * * *